US012740246B2

(12) United States Patent
Sung et al.

(10) Patent No.: US 12,740,246 B2
(45) Date of Patent: Sep. 15, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Wooyong Sung, Yongin-si (KR); Seungyong Song, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 472 days.

(21) Appl. No.: 18/204,511

(22) Filed: Jun. 1, 2023

(65) Prior Publication Data

US 2024/0065034 A1 Feb. 22, 2024

(30) Foreign Application Priority Data

Aug. 18, 2022 (KR) ........................ 10-2022-0103337

(51) Int. Cl.

| | |
|---|---|
| ***H10K 59/122*** | (2023.01) |
| ***H10K 59/12*** | (2023.01) |
| ***H10K 59/38*** | (2023.01) |
| ***H10K 59/80*** | (2023.01) |
| ***H10K 71/20*** | (2023.01) |

(52) U.S. Cl.

CPC ....... *H10K 59/122* (2023.02); *H10K 59/1201* (2023.02); *H10K 59/38* (2023.02); *H10K 59/873* (2023.02); *H10K 59/879* (2023.02); *H10K 59/8792* (2023.02); *H10K 71/231* (2023.02)

(58) Field of Classification Search

CPC ......................... H10K 59/122; H10K 59/1201

See application file for complete search history.

(56) References Cited

U.S. PATENT DOCUMENTS

| | | | |
|---|---|---|---|
| 10,566,572 | B2 | 2/2020 | Oh et al. |
| 10,978,669 | B2 | 4/2021 | Lee et al. |
| 11,205,685 | B2 | 12/2021 | Han et al. |

(Continued)

FOREIGN PATENT DOCUMENTS

| | | | |
|---|---|---|---|
| CN | 112968136 | A | 6/2021 |
| JP | 2008135325 | A | 6/2008 |

(Continued)

OTHER PUBLICATIONS

Extended European Search Report dated Dec. 19, 2023, issued in corresponding EP Patent Application No. 23192018.2 (8 pages).

*Primary Examiner* — Joseph L Williams

(74) *Attorney, Agent, or Firm* — CANTOR COLBURN LLP

(57) ABSTRACT

A display apparatus includes a pixel electrode, a bank layer including a first inorganic bank layer, a first metal bank layer, a second inorganic bank layer, and a second metal bank layer, which are sequentially stacked, and in which a pixel opening overlapping the pixel electrode and penetrating the first inorganic bank layer, the first metal bank layer, the second inorganic bank layer, and the second metal bank layer is defined, an intermediate layer disposed on the pixel electrode through the pixel opening of the bank layer, a counter electrode disposed on the intermediate layer through the pixel opening of the bank layer, and an inorganic encapsulation layer on the counter electrode. The counter electrode directly contacts with a side surface of the first metal bank layer defining the pixel opening.

23 Claims, 19 Drawing Sheets

(56) References Cited

U.S. PATENT DOCUMENTS

| | | | | |
|---|---|---|---|---|
| 11,245,093 | B2 | 2/2022 | Sung et al. | |
| 2007/0071885 | A1 | 3/2007 | Kumagai | |
| 2017/0279084 | A1 | 9/2017 | Sakamoto et al. | |
| 2020/0403180 | A1 | 12/2020 | Seon et al. | |
| 2022/0077434 | A1 | 3/2022 | Seo et al. | |
| 2024/0188342 | A1* | 6/2024 | Jung | H10K 59/131 |
| 2024/0188399 | A1* | 6/2024 | Sung | H10K 50/858 |
| 2024/0284716 | A1* | 8/2024 | Yoo | H10K 59/1315 |
| 2025/0143143 | A1* | 5/2025 | Bang | H10K 59/8731 |

FOREIGN PATENT DOCUMENTS

| | | | |
|---|---|---|---|
| KR | 1020150033345 | A | 4/2015 |
| KR | 20170110012 | A | 10/2017 |
| KR | 101818480 | B1 | 1/2018 |
| KR | 1020190029830 | A | 3/2019 |
| KR | 1020190082362 | A | 7/2019 |
| KR | 102248402 | B1 | 5/2021 |
| KR | 20220031837 | A | 3/2022 |

* cited by examiner

P1
P2
P3
500
530 520 510
232b
222b
231b
221b
233b
223b
OP1
OP2
OP3
360
355
350
353
351
300
340
ED1
ED2
ED3
330
325
211 221 231
212 222 232
213 223 233
320
323
321
113
310
111
CM
109
107
105
103
101
100
PC1
PC2
PC3
z
PA1
NPA
PA2
NPA
PA3

DISPLAY APPARATUS AND METHOD OF MANUFACTURING THE SAME

This application claims priority to Korean Patent Application No. 10-2022-0103337, filed on Aug. 18, 2022, and all the benefits accruing therefrom under 35 U.S.C. § 119, the content of which in its entirety is herein incorporated by reference.

BACKGROUND

1. Field

Embodiments relate to a display apparatus and a method of manufacturing the display apparatus.

2. Description of the Related Art

Recently, a use of display apparatuses is being diversified. Furthermore, as a thickness and a weight of a display apparatus are being decreased, a scope of a use thereof is being expanded.

Generally, to display an image, a display apparatus may include a plurality of pixels that receive an electrical signal and emit light. The pixels of an organic light-emitting display device ("OLED") include an organic light-emitting diode as a display element. An organic light-emitting diode may include a pixel electrode, a light-emitting layer, and a counter electrode.

The display apparatus may include an encapsulation layer for sealing a light-emitting diode to prevent external oxygen or moisture from infiltrating into the light-emitting diode.

SUMMARY

A display apparatus according to the related art has a problem in that, even when a local defect is generated in an encapsulation layer, an impurity infiltration path is generated so that the defect is propagated to neighboring pixels.

Embodiments provide a display apparatus in which each pixel is encapsulated, and a method of manufacturing the display apparatus. However, such an objective is exemplary, and the scope of the disclosure is not limited thereby.

Additional features will be set forth in part in the description which follows and, in part, will be apparent from the description, or may be learned by practice of the presented embodiments of the disclosure.

According to an embodiment of the disclosure, a display apparatus includes a pixel electrode, a bank layer including a first inorganic bank layer, a first metal bank layer, a second inorganic bank layer, and a second metal bank layer, which are sequentially stacked, and in which a pixel opening overlapping the pixel electrode and penetrating the first inorganic bank layer, the first metal bank layer, the second inorganic bank layer, and the second metal bank layer, an intermediate layer disposed on the pixel electrode through the pixel opening of the bank layer, a counter electrode disposed on the intermediate layer through the pixel opening of the bank layer, and an inorganic encapsulation layer on the counter electrode. The counter electrode directly contacts a side surface of the first metal bank layer defining the pixel opening.

In an embodiment, the first metal bank layer includes a first sub-metal layer, and a second sub-metal layer on the first sub-metal layer, and a part of the second sub-metal layer may form a first tip protruding from a side surface of the first sub-metal layer defining the pixel opening.

In an embodiment, the inorganic encapsulation layer may directly contact a surface of the first tip exposed by the first sub-metal layer.

In an embodiment, the display apparatus may further include a third inorganic bank layer between the first metal bank layer and the second inorganic bank layer. The second inorganic bank layer may include a second tip protruding from a side surface of the third inorganic bank layer defining the pixel opening, and the inorganic encapsulation layer may directly contact a surface of the second tip exposed by the third inorganic bank layer.

In an embodiment, a protruding length of the first tip may be different from a protruding length of the second tip.

In an embodiment, the second metal bank layer may include a second tip protruding from a side surface of the second inorganic bank layer defining the pixel opening, and the inorganic encapsulation layer may directly contact a surface of the second tip exposed by the second inorganic bank layer.

In an embodiment, the second metal bank layer may include a fourth sub-metal layer, and a fifth sub-metal layer on the fourth sub-metal layer, the fifth sub-metal layer may include a third tip protruding from a side surface of the fourth sub-metal layer defining the pixel opening, and the inorganic encapsulation layer may directly contact a surface of the third tip exposed by the fourth sub-metal layer.

In an embodiment, a protruding length of the first tip may be different from a protruding length of the third tip.

In an embodiment, the display apparatus may further include a planarization layer disposed on the inorganic encapsulation layer and filling the pixel opening.

In an embodiment, the display apparatus may further include a protection layer on the planarization layer. The inorganic encapsulation layer may directly contact the protection layer, on the second metal bank layer.

In an embodiment, the inorganic encapsulation layer may have a first refractive index, and the planarization layer may have a second refractive index greater than the first refractive index.

In an embodiment, the display apparatus may further include an organic bank layer between the second metal bank layer and the inorganic encapsulation layer.

In an embodiment, the display apparatus may further include a light-blocking layer which is disposed on the inorganic encapsulation layer and in which a filter opening overlapping the pixel electrode is defined, and a color filter layer corresponding to the pixel electrode.

In an embodiment, the display apparatus may further include an electrode protection layer between an edge of the pixel electrode and the first inorganic bank layer.

According to an embodiment of the disclosure, the method includes forming a pixel electrode and an electrode protection layer corresponding to the pixel electrode, forming a bank layer on the pixel electrode, the bank layer including a first inorganic bank layer, a first metal bank layer, a second inorganic bank layer, a second metal bank layer, and an organic bank layer, defining a pixel opening overlapping the pixel electrode and penetrating the bank layer, forming an intermediate layer disposed on the pixel electrode through the pixel opening of the bank layer, forming a counter electrode disposed on the intermediate layer through the pixel opening of the bank layer and directly contacting with a side surface of the first metal bank layer, and forming an inorganic encapsulation layer on the counter electrode.

In an embodiment, the first metal bank layer may include a first sub-metal layer and a second sub-metal layer on the first sub-metal layer, the defining the pixel opening may include selectively etching the first sub-metal layer of the first sub-metal layer and the second sub-metal layer, and a part of the second sub-metal layer may form a first tip protruding from a side surface of the first sub-metal layer defining the pixel opening.

In an embodiment, the forming the inorganic encapsulation layer may include depositing the inorganic encapsulation layer such that the inorganic encapsulation layer may directly contact with a surface of the first tip exposed by the first sub-metal layer.

In an embodiment, the forming the bank layer may include forming a third inorganic bank layer between the first metal bank layer and the second inorganic bank layer, the defining the pixel opening may include selectively etching the third inorganic bank layer, and a part of the second inorganic bank layer may form a second tip protruding from a side surface of the third inorganic bank layer defining the pixel opening.

In an embodiment, the defining the pixel opening may include selectively etching the second inorganic bank layer, and the second metal bank layer may form a second tip protruding from a side surface of the second inorganic bank layer defining the pixel opening.

In an embodiment, the second metal bank layer may include a fourth sub-metal layer and a fifth sub-metal layer on the fourth sub-metal layer, the defining the pixel opening may include selectively etching the fourth sub-metal layer of the fourth sub-metal layer and the fifth sub-metal layer, and a part of the fifth sub-metal layer may form a third tip protruding from a side surface of the fourth sub-metal layer defining the pixel opening.

In an embodiment, the method may further include forming a planarization layer disposed on the inorganic encapsulation layer and filling the pixel opening.

In an embodiment, the method may further include removing the organic bank layer between the defining the pixel opening and the forming the intermediate layer.

In an embodiment, the method may further include forming a light-blocking layer disposed on the inorganic encapsulation layer and defining a filter opening overlapping the pixel electrode, and forming a color filter layer in the filter opening corresponding to the pixel electrode.

Other features and advantages than those described above will become apparent from the following drawings, claims, and detailed description of the disclosure

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
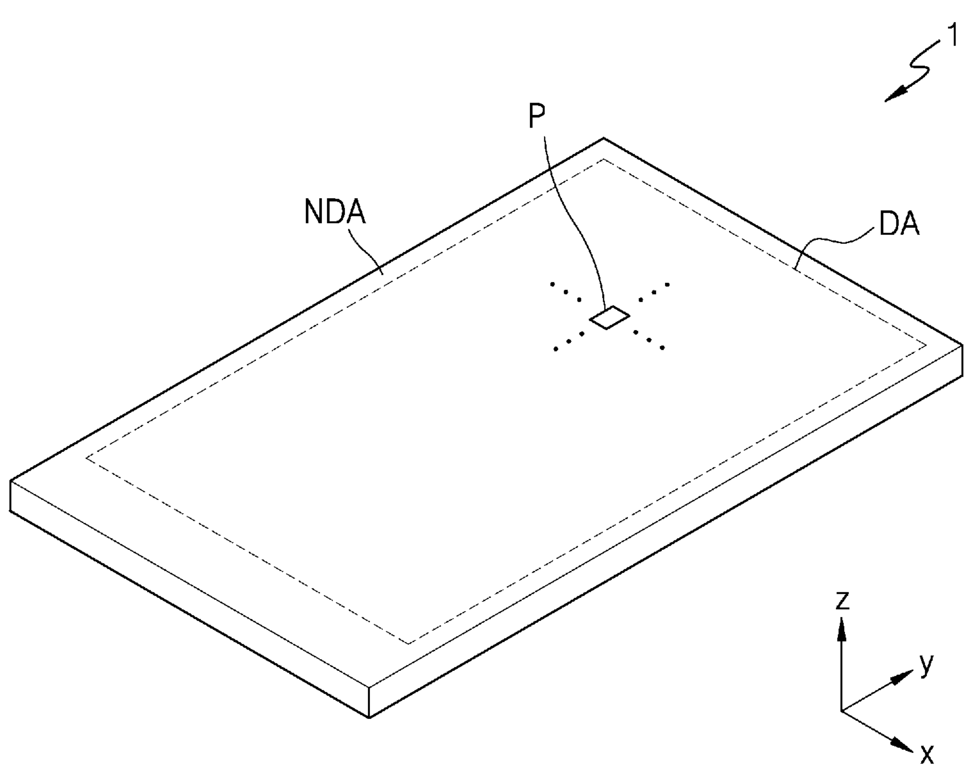
FIG. 1 is a schematic perspective view of an embodiment of a display apparatus.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the illustrated embodiments, and particular embodiments will be illustrated in the drawings and described in the detailed description section. The effect and features of the illustrated embodiments, and a method to achieve the same, will become clearer by referring to the detailed descriptions below along with the drawings. However, the illustrated embodiments may be implemented in various forms, not by being limited to the embodiments presented below.

Hereinafter, embodiments will be described in detail with reference to the accompanying drawings, and in the description with reference to the drawings, the same or corresponding constituents are indicated by the same reference numerals and redundant descriptions thereof are omitted.

In the following embodiment, it will be understood that although the terms "first," "second," etc. may be used herein to describe various components, these components should not be limited by these terms. These terms are only used to distinguish one component from another.

In the following embodiment, as used herein, the singular forms are intended to include the plural forms as well, unless the context clearly indicates otherwise.

In the following embodiment, it will be further understood that the terms "comprises" and/or "comprising" used herein specify the presence of stated features or components, but do not preclude the presence or addition of one or more other features or components.

In the following embodiment, it will be understood that when a layer, region, or component is referred to as being "formed on" another layer, region, or component, it can be directly or indirectly formed on the other layer, region, or component. That is, for example, intervening layers, regions, or components may be present.

In the following embodiment, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the specification, the expression such as "A and/or B" may include A, B, or A and B. Furthermore, the expression such as "at least one of A and B" may include A, B, or A and B.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The term "about" used when referring to any numerical value in the specification may mean including numerical values within a generally acceptable range in the technology field due to measurement limits or errors. For example, the term "about" may mean including values in the range of ±30%, 20%, 10% or 5% of any numerical value.

When an illustrative embodiment may be implemented differently, a specific process order may be performed differently from the described order. For example, two consecutively described processes may be performed substantially at the same time or performed in an order opposite to the described order.

Sizes of components in the drawings may be exaggerated for convenience of explanation. For example, since sizes and thicknesses of components in the drawings are arbitrarily illustrated for convenience of explanation, the following the disclosure is not limited thereto.

FIG. 1 is a schematic perspective view of an embodiment of a display apparatus 1.

Referring to FIG. 1, the display apparatus 1 may include a display area DA and a non-display area NDA arranged outside the display area DA. The display area DA may display an image through a plurality of pixels P arranged in the display area DA. The non-display area NDA is a non-display area disposed outside the display area DA and where no image is displayed, and may surround an entirety of the display area DA. Drivers for providing electrical signals or power to the display area DA, or the like may be arranged in the non-display area NDA. A pad that is an area to which electronic elements, printed circuit boards, or the like may be electrically connected may be disposed in the non-display area NDA.

In an embodiment, although FIG. 1 illustrates that the display area DA is a polygon, e.g., a rectangle, in which the length in an x direction is less than the length in a y direction, the disclosure is not limited thereto. In another embodiment, the display area DA may have various shapes, such as N-gonal (where N is a natural number of three or more), circular, oval, or the like. Although FIG. 1 illustrates that the display area DA has a shape in which a corner portion thereof includes a vertex where a straight line and another straight line meet, in another embodiment, the display area DA may be a polygon with a round corner portion.

In the following description, for convenience of explanation, a case in which the display apparatus 1 is an electronic device that is a smart phone is described, but the display apparatus 1 is not limited thereto. The display apparatus 1 may be applied to various products including not only portable electronic devices, such as mobile phones, smart phones, tablet personal computers, mobile communication terminals, electronic organizers, electronic books, portable multimedia players ("PMPs"), navigation devices, ultra-mobile personal computers ("UMPCs"), or the like, but also televisions, notebook computers, monitors, billboards, internet of things ("IoT"), or the like. Furthermore, the display apparatus 1 in an embodiment may be applied to wearable devices, such as smart watches, watch phones, glasses type displays, and head mounted displays ("HMDs"). Furthermore, the display apparatus 1 in an embodiment may be applied to an instrument panel of a vehicle, and a center information display ("CID") disposed in a center fascia or dashboard of a vehicle, a room mirror display in lieu of a side mirror of a vehicle, and a display screen disposed on the backside of the front seat as an entertainment for the rear seat of a vehicle.

Figure 2:
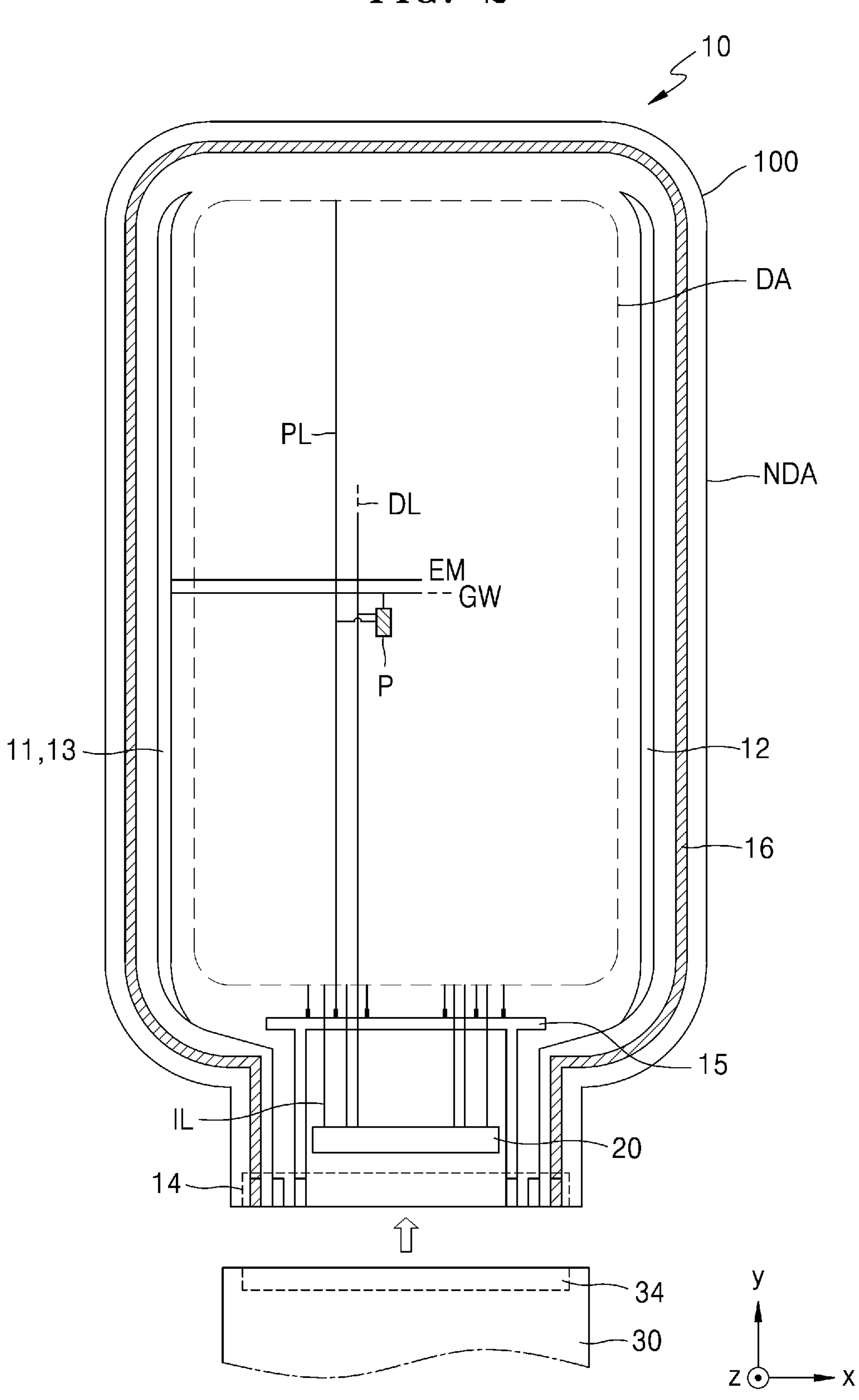
FIG. 2 is a schematic plan view of an embodiment of a display panel included in a display apparatus.

FIG. 2 is a schematic plan view of an embodiment of a display panel included in a display apparatus. FIG. 2 may be understood as a shape of a substrate 100 of a display panel 10.

Referring to FIG. 2, the display panel 10 may include the display area DA and the non-display area NDA arranged outside the display area DA. The display area DA is a portion for displaying an image, and the pixels P may be arranged in the display area DA. Although FIG. 2 illustrates that the display area DA has an approximately quadrangular (e.g., rectangular) shape with a round corner, the disclosure is not limited thereto. As described above, the display area DA may have various shapes, such as N-gonal (where N is a natural number of three or more), circular, oval, or the like.

Figure 3:
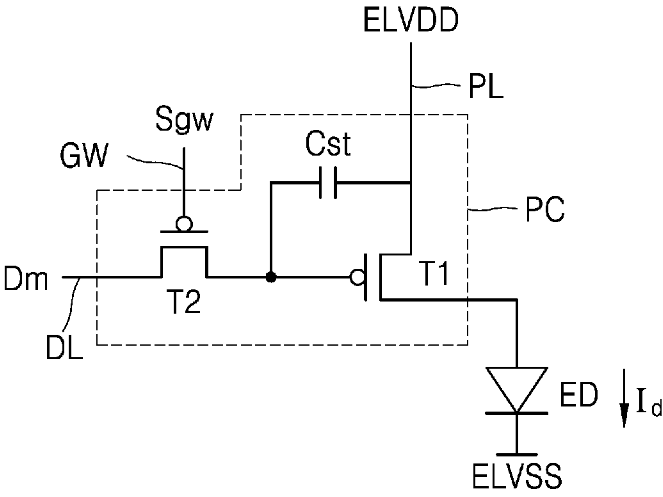
FIGS. 3 and 4 are schematic equivalent circuit diagrams of an embodiment of a pixel included in a display apparatus.

Each of the pixels P means a sub-pixel, and may include a display element, such as an organic light-emitting diode ED (refer to FIG. 3). Each of the pixels P may emit, e.g., red, green, blue, or white light.

The non-display area NDA may be disposed outside the display area DA. Outside circuits for driving each of the pixels P may be arranged in the non-display area NDA. A first scan driving circuit 11, a second scan driving circuit 12, an emission control driving circuit 13, a terminal 14, a driving power supply wiring 15, and a common power supply wiring 16 may be arranged in the non-display area NDA.

The first scan driving circuit 11 may provide a scan signal to each of the pixels P through a scan line GW. The second scan driving circuit 12 may be disposed parallel to the first scan driving circuit 11 with the display area DA therebetween. Some of the pixels P arranged in the display area DA may be electrically connected to the first scan driving circuit 11, and the other pixels P may be connected to the second scan driving circuit 12. As desired, the second scan driving circuit 12 may be omitted, and the pixels P arranged in the display area DA may all be electrically connected to the first scan driving circuit 11.

The emission control driving circuit 13 is disposed at the side of the first scan driving circuit 11, and may provide an emission control signal to each of the pixels P through an emission control line EM. Although FIG. 1 illustrates that the emission control driving circuit 13 is disposed only in one side of the display area DA, the emission control driving circuit 13 may be disposed in opposite sides of the display area DA like the first scan driving circuit 11 and the second scan driving circuit 12.

A driving chip 20 may be disposed in the non-display area NDA. The driving chip 20 may include an integrated circuit including the display panel 10. The integrated circuit may be a data driving integrated circuit for generating a data signal, but the disclosure is not limited thereto.

The terminal 14 may be disposed in the non-display area NDA. The terminal 14 that is exposed by not being covered with an insulating layer may be electrically connected to a printed circuit board 30. A terminal 34 of the printed circuit board 30 may be electrically connected to the terminal 14 of the display panel 10.

The printed circuit board 30 sends a signal or power of a control unit (not shown) to the display panel 10. A control signal generated by the control unit may be sent to each of driving circuits through the printed circuit board 30. Furthermore, the control unit may send a driving voltage ELVDD to the driving power supply wiring 15 and a common voltage ELVSS to the common power supply wiring 16. The driving voltage ELVDD may be sent to each of the pixels P through a driving voltage line PL connected to the driving power supply wiring 15, and the common voltage ELVSS may be sent to a counter electrode of each of the pixels P through a first metal bank layer 320 (refer to FIG. 6) connected to the common power supply wiring 16. The driving power supply wiring 15 may have a shape extending in one direction (X-axis direction) under the display area DA. The common power supply wiring 16 has a loop shape having one open side, partially surrounding the display area DA.

The control unit may generate a data signal, and the generated data signal is sent to an input line IL through the driving chip 20, and to each of the pixels P through a data line DL connected to the input line IL. For reference, a "line" may mean a "wiring." This is the same as in embodiments and modifications thereof described below.

Figure 4:
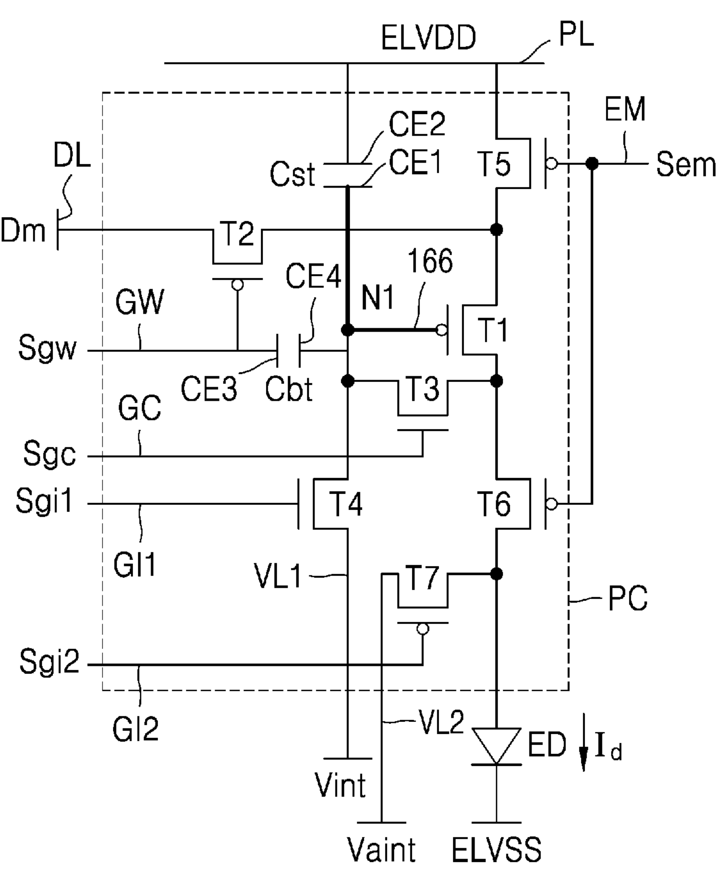

FIGS. 3 and 4 are schematic equivalent circuit diagrams of an embodiment of a pixel included in a display apparatus.

Referring to FIG. 3, a light-emitting diode ED is electrically connected to a pixel circuit PC, and the pixel circuit PC may include a first transistor T1, a second transistor T2, and a storage capacitor Cst.

The second transistor T2 sends a data signal Dm input through the data line DL to the first transistor T1, in response to a scan signal Sgw input through a scan line GW.

The storage capacitor Cst is connected to the second transistor T2 and the driving voltage line PL, and stores a voltage corresponding to a difference between a voltage received from the second transistor T2 and the driving voltage ELVDD supplied through the driving voltage line PL.

The first transistor T1 is connected to the driving voltage line PL and the storage capacitor Cst, and may control a driving current Id flowing in the light-emitting diode ED from the driving voltage line PL, corresponding to a voltage value stored in the storage capacitor Cst. A counter electrode (e.g., a cathode) of the light-emitting diode ED may receive a common voltage ELVSS. The light-emitting diode ED may emit light having a predetermined luminance by the driving current Id.

Although FIG. 3 illustrates a case in which the pixel circuit PC includes two transistors and one storage thin film transistor, the disclosure is not limited thereto.

Referring to FIG. 4, the pixel circuit PC may include seven transistors and two capacitors.

The pixel circuit PC may include first to seventh transistors T1, T2, T3, T4, T5, T6, and T7, a storage capacitor Cst, and a boost capacitor Cbt. In another embodiment, the pixel circuit PC may not include the boost capacitor Cbt.

Some of the first to seventh transistors T1, T2, T3, T4, T5, T6, and T7 may be n-channel metal-oxide-semiconductor field-effect transistors ("MOSFETs"), and the others thereof may be p-channel MOSFETs. In another embodiment, the third, fourth, and seventh transistors T3, T4, and T7 may be n-channel MOSFETs, and the others thereof may be p-channel MOSFETs.

The first to seventh transistors T1, T2, T3, T4, T5, T6, and T7, the storage capacitor Cst, and the boost capacitor Cbt may be connected to a signal line. The signal line may include the scan line GW, an emission control line EM, a compensation gate line GC, a first initialization gate line GI1, a second initialization gate line GI2, and the data line DL. The pixel circuit PC may be electrically connected to a voltage line, e.g., the driving voltage line PL, a first initialization voltage line VL1, and a second initialization voltage line VL2.

The first transistor T1 may be a driving transistor. A first gate electrode of the first transistor T1 is connected to the storage capacitor Cst, a first electrode of the first transistor T1 is electrically connected to the driving voltage line PL via the fifth transistor T5, and a second electrode of the first transistor T1 may be electrically connected to a pixel electrode (e.g., an anode) of the light-emitting diode ED via the sixth transistor T6. One of the first electrode and the second electrode of the first transistor T1 may be a source electrode, and the other may be a drain electrode. The first transistor T1 may supply the driving current Id to the light-emitting diode ED according to a switching operation of the second transistor T2.

The second transistor T2 may be a switching transistor. A second gate electrode of the second transistor T2 is connected to the scan line GW, a first electrode of the second transistor T2 is connected to the data line DL, and a second electrode of the second transistor T2 is connected to the first electrode of the first transistor T1 and electrically connected to the driving voltage line PL via the fifth transistor T5. One of the first electrode and the second electrode of the second transistor T2 may be a source electrode, and the other may be a drain electrode. The second transistor T2 is turned on in response to the scan signal Sgw received through the scan line GW, and may perform a switching operation of sending the data signal Dm sent through the data line DL to the first electrode of the first transistor T1.

The third transistor T3 may be a compensation transistor for compensating a threshold voltage of the first transistor T1. A third gate electrode of the third transistor T3 is connected to the compensation gate line GC. A first electrode of the third transistor T3 is connected to a lower electrode CE1 of the storage capacitor Cst and a first gate electrode of the first transistor T1 through a node connection line 166. The first electrode of the third transistor T3 may be connected to the fourth transistor T4. A second electrode of the third transistor T3 is connected to the second electrode of the first transistor T1 and electrically connected to the pixel electrode (e.g., an anode) of the light-emitting diode ED via the sixth transistor T6. One of the first electrode and the second electrode of the third transistor T3 may be a source electrode, and the other may be a drain electrode.

The third transistor T3 is turned on in response to a compensation signal Sgc received through the compensation gate line GC, and electrically connects the first gate electrode and the second electrode (e.g., a drain electrode) of the first transistor T1 to each other, thereby diode-connecting the first transistor T1.

The fourth transistor T4 may be a first initialization transistor to initialize the first gate electrode of the first transistor T1. A fourth gate electrode of the fourth transistor T4 is connected to the first initialization gate line GI1. A first electrode of the fourth transistor T4 is connected to the first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 is turned on in response to a first initialization signal Sgi1 received through the first initialization gate line GI1, and sends a first initialization voltage Vint to the first gate electrode of the first transistor T1, thereby performing an initialization operation to initialize the voltage of the first gate electrode of the first transistor T1.

The fifth transistor T5 may be an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may be an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the pixel electrode (e.g., an anode) of the light-emitting diode ED. One of the first electrode and the second electrode of the sixth transistor T6 may be a source electrode, and the other may be a drain electrode.

The fifth transistor T5 and the sixth transistor T6 are simultaneously turned on in response to an emission control signal Sem received through the emission control line EM, and sends the driving voltage ELVDD to the light-emitting diode ED, thereby allowing the driving current Id to flow in the light-emitting diode ED.

The seventh transistor T7 may be a second initialization transistor that initialize the pixel electrode (e.g., an anode) of the light-emitting diode ED. A seventh gate electrode of the seventh transistor T7 is connected to the second initialization gate line GI2. A first electrode of the seventh transistor T7 is connected to the second initialization voltage line VL2. A second electrode of the seventh transistor T7 is connected to the second electrode of the sixth transistor T6 and the pixel electrode (e.g., an anode) of the light-emitting diode ED. The seventh transistor T7 is turned on in response to a second initialization signal Sgi2 received through the second initialization gate line GI2, and sends a second initialization voltage Vaint to the pixel electrode (e.g., an anode) of the light-emitting diode ED, thereby initializing the pixel electrode of the light-emitting diode ED.

In some embodiments, the second initialization gate line GI2 may serve as a next scan line. In an embodiment, the second initialization gate line GI2 connected to the seventh transistor T7 of the pixel circuit PC disposed in the i-th row, where "i" is a natural number, may correspond to a scan line of the pixel circuit PC disposed in the (i+1)th row, for example. In another embodiment, the second initialization gate line GI2 may serve as the emission control line EM. In an embodiment, the emission control line EM may be electrically connected to the fifth to seventh transistors T5, T6, and T7, for example.

The storage capacitor Cst may include the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may store electric charges corresponding to a difference between the voltage of the first gate electrode of the first transistor T1 and the driving voltage ELVDD.

The boost capacitor Cbt may include a third electrode CE3 and a fourth electrode CE4. The third electrode CE3 is connected to the second gate electrode of the second transistor T2 and the scan line GW, and the fourth electrode CE4 may be connected to the first electrode of the third transistor T3 and the node connection line 166. The boost capacitor Cbt may increase a voltage of a first node N1 when the scan signal Sgw supplied through the scan line GW is turn off, and when the voltage of the first node N1 is increased, black gradation may be clearly expressed.

The first node N1 may be an area where the first gate electrode of the first transistor T1, the first electrode of the third transistor T3, the second electrode of the fourth transistor T4, and the fourth electrode CE4 of the boost capacitor Cbt are connected to one another.

In an embodiment, FIG. 4 illustrates that the third and fourth transistors T3 and T4 are n-channel MOSFETs, and the first, second, fifth, sixth, and seventh transistors T1, T2, T5, T6, and T7 are p-channel MOSFETs. The first transistor T1 that directly affects the brightness of a display apparatus for displaying an image includes a semiconductor layer including polycrystalline silicon having substantially high reliability, and accordingly, a high-resolution display apparatus may be implemented.

FIG. 5A to FIG. 5I are schematic cross-sectional views showing an embodiment of some operations of a method of manufacturing a display apparatus.

Figure 5A:
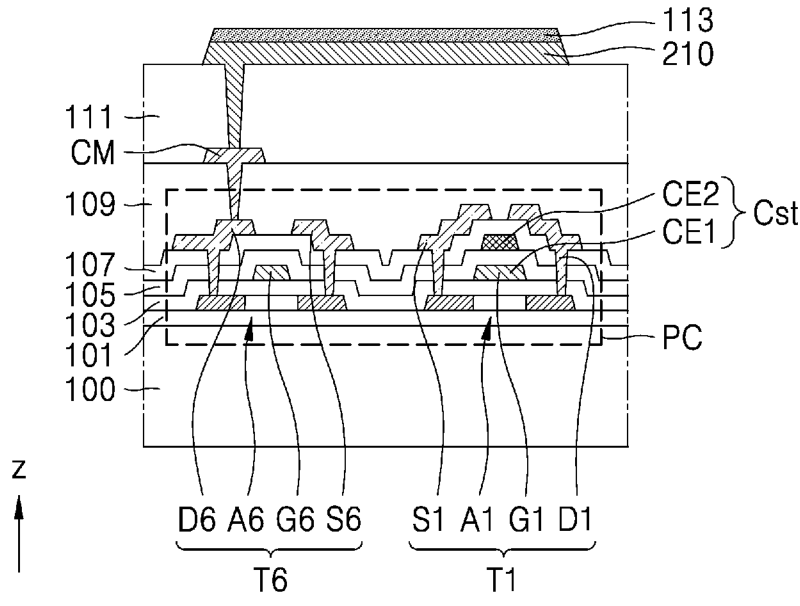
FIG. 5A to FIG. 5I are schematic cross-sectional views showing an embodiment of some operations of a method of manufacturing a display apparatus.

Referring to FIG. 5A, the pixel circuit PC may be formed on the substrate 100. The substrate 100 may include glass material or polymer resin. The substrate 100 may have a structure in which a base layer including polymer resin and an inorganic barrier layer area stacked. The polymer resin may include polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate, cellulose triacetate ("TAC"), and cellulose acetate propionate ("CAP").

A buffer layer 101 may be disposed on an upper surface of the substrate 100. The buffer layer 101 may prevent impurities from infiltrating into a semiconductor layer of a transistor. The buffer layer 101 may include an inorganic insulating material, such as a silicon nitride, a silicon oxynitride, and a silicon oxide, and may be a single layer or multilayer including the inorganic insulating material described above.

The pixel circuit PC may be disposed on the buffer layer 101. The pixel circuit PC may include a plurality of transistors and storage capacitors, as described in FIG. 3 or 4. In an embodiment, FIG. 5A illustrates the first transistor T1, the sixth transistor T6, and the storage capacitor Cst of the pixel circuit PC.

The first transistor T1 may include a first semiconductor layer A1 on the buffer layer 101 and a first gate electrode G1 overlapping a channel region of the first semiconductor layer A1. The first semiconductor layer A1 may include a silicon-based semiconductor material, e.g., polysilicon. The first semiconductor layer A1 may include the channel region, and a first region and a second region arranged in opposite sides of the channel region. The first region and the second region are regions including impurities having a higher concentration than that of the channel region, and any one of the first region and the second region may correspond to a source region and the other may correspond to a drain region.

The sixth transistor T6 may include a sixth semiconductor layer A6 on the buffer layer 101 and a sixth gate electrode G6 overlapping the channel region of the sixth semiconductor layer A6. The sixth semiconductor layer A6 may include a silicon-based semiconductor material, e.g., polysilicon. The sixth semiconductor layer A6 may include a channel region, and a first region and a second region arranged in opposite sides of the channel region. The first region and the second region are regions including impurities having a higher concentration than that of the channel region, and any one of the first region and the second region may correspond to a source region and the other may correspond to a drain region.

The first gate electrode G1 and the sixth gate electrode G6 may each include a conductive material including molybdenum (Mo), aluminum (Al), copper (Cu), titanium (Ti), or the like, and a single layer or multilayer structure including the material described above. A first gate insulating layer 103 for electrical insulation from the first semiconductor layer A1 and the sixth semiconductor layer A6 may be arranged below the first gate electrode G1 and the sixth gate electrode G6. The first gate insulating layer 103 may include an inorganic insulating material, such as a silicon nitride, a silicon oxynitride, and a silicon oxide, and may be a single layer or multilayer including the inorganic insulating material described above.

The storage capacitor Cst may include the lower electrode CE1 and the upper electrode CE2 overlapping each other. In an embodiment, the lower electrode CE1 of the storage capacitor Cst may include the first gate electrode G1. In other words, the first gate electrode G1 may include the lower electrode CE1 of the storage capacitor Cst. In an embodiment, the first gate electrode G1 and the lower electrode CE1 of the storage capacitor Cst may be unitary, for example.

A first inter-insulating layer 105 may be disposed between the lower electrode CE1 and the upper electrode CE2 of the storage capacitor Cst. The first inter-insulating layer 105 may include an inorganic insulating material, such as a silicon oxide, a silicon nitride, and a silicon oxynitride, and have a single layer or multilayer structure including the inorganic insulating material described above.

The upper electrode CE2 of the storage capacitor Cst may include a low-resistance conductive material, such as Mo, Al, Cu, and/or Ti, and have a single layer or multilayer structure including the material described above.

A second inter-insulating layer 107 may be disposed on the storage capacitor Cst. The second inter-insulating layer 107 may include an inorganic insulating material, such as a silicon oxide, a silicon nitride, and a silicon oxynitride, and have a single layer or multilayer structure including the inorganic insulating material described above.

A source electrode S1 and/or a drain electrode D1 electrically connected to the first semiconductor layer A1 of the first transistor T1 may be disposed on the second inter-insulating layer 107. A source electrode S6 and/or a drain electrode D6 electrically connected to the sixth semiconductor layer A6 of the sixth transistor T6 may be disposed on the second inter-insulating layer 107. The source electrodes S1 and S6 and/or the drain electrodes D1 and D6 may each include Al, Cu, and/or Ti, and may be in a single layer or multilayer including the material described above.

A first organic insulating layer 109 may be disposed on the pixel circuit PC. The first organic insulating layer 109 may include an organic insulating material, such as acryl, benzocyclobutene ("BCB"), polyimide, hexamethyldisiloxane ("HMDSO"), or the like.

A connection metal CM may be disposed on the first organic insulating layer 109. The connection metal CM may include Al, Cu, and/or Ti, and may be in a single layer or multilayer including the material described above.

A second organic insulating layer 111 may be disposed between the connection metal CM and a pixel electrode 210. The second organic insulating layer 111 may include an organic insulating material, such as acryl, BCB, polyimide, HMDSO, or the like. According to the embodiment described with reference to FIG. 5A, although the pixel circuit PC and the pixel electrode 210 are electrically connected to each other via the connection metal CM, in another embodiment, the connection metal CM may be omitted, and one organic insulating layer may be disposed between the pixel circuit PC and the pixel electrode 210. In an alternative embodiment, three or more organic insulating layers may be arranged between the pixel circuit PC and the pixel electrode 210, and the pixel circuit PC and the pixel electrode 210 may be electrically connected to each other via a plurality of connection metals.

The pixel electrode 210 may be formed on the second organic insulating layer 111. The pixel electrode 210 may be a (semi-)transparent electrode or a reflective electrode. When the pixel electrode 210 is a (semi-)transparent electrode, the pixel electrode 210 may include or consist of an indium tin oxide ("ITO"), an indium zinc oxide ("IZO"), a zinc oxide (ZnO), an indium oxide ($In_2O_3$), an indium gallium oxide ("IGO"), or an aluminum zinc oxide ("AZO"), for example. When the pixel electrode 210 is a reflective electrode, the pixel electrode 210 may include or consist of Ag, Mg, Al, Pt, Pd, Au, Ni, Nd, Ir, Cr, any combinations thereof, or the like, and a film including ITO, IZO, ZnO, or $In_2O_3$ may be formed on the reflective film. In an embodiment, the pixel electrode 210 may have a structure in which an ITO layer, an Ag layer, and an ITO layer are sequentially stacked. The pixel electrode 210 may be electrically connected to the connection metal CM via a contact hole of the second organic insulating layer 111.

An electrode protection layer 113 may be formed on the pixel electrode 210. The electrode protection layer 113 may be patterned with the pixel electrode 210. In an embodiment, the pixel electrode 210 and the electrode protection layer 113 may be formed by the same mask, for example. The electrode protection layer 113 may prevent the pixel electrode 210 from being damaged by a gas, a liquid material, or the like used in various processes, such as an etching process, an ashing process, or the like, included in a process of manufacturing a display apparatus. The thickness of the electrode protection layer 113 may be about 500 angstroms (Å), but the disclosure is not limited thereto. The electrode protection layer 113 may include a material that is selectively etched without damage to the pixel electrode 210. In an embodiment, the electrode protection layer 113 may include a conductive oxide, such as IZO and/or an indium gallium zinc oxide ("IGZO"), for example.

Figure 5B:
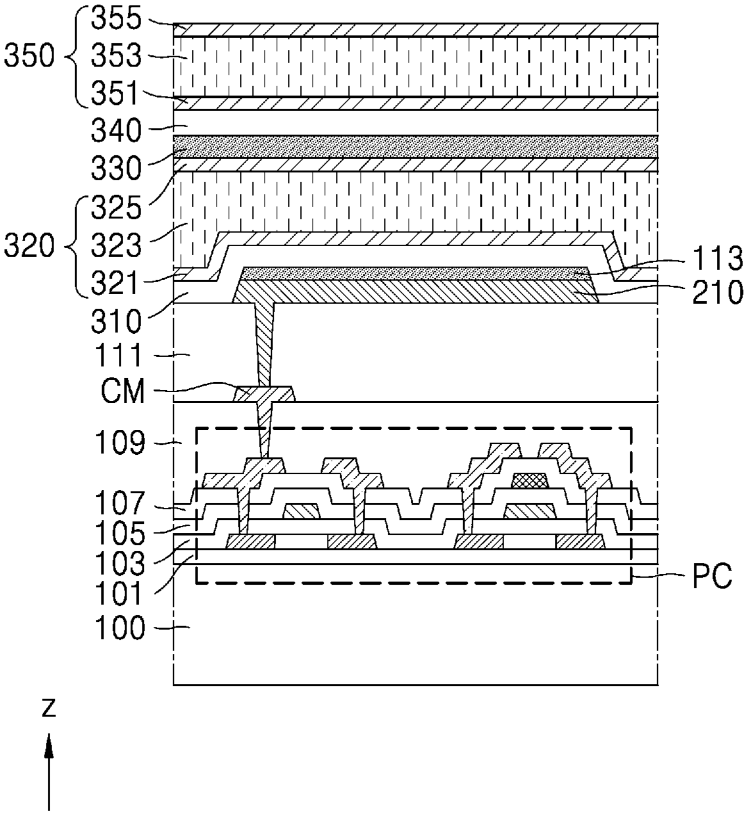

Referring to FIG. 5B, to cover the pixel electrode 210, a first inorganic bank layer 310, a first metal bank layer 320, a second inorganic bank layer 340, and a second metal bank layer 350 may be sequentially formed.

The first inorganic bank layer 310 may be formed over an entirety of the substrate 100. In an embodiment, the first inorganic bank layer 310 may overlap the pixel electrode 210 and the electrode protection layer 113 and may be in direct contact with an upper surface of the second organic insulating layer 111 where the pixel electrode 210 and the electrode protection layer 113 do not exist, for example. The first inorganic bank layer 310 may include an inorganic insulating material, such as a silicon oxide, a silicon nitride, and a silicon oxynitride, and have a single layer or multilayer structure including the inorganic insulating material described above.

The first metal bank layer 320 may be formed on an entirety of the first inorganic bank layer 310. The first metal bank layer 320 may include a plurality of sub-metal layers including different metals. In this regard, FIG. 5B illustrates that the first metal bank layer 320 includes a first sub-metal layer 323, a second sub-metal layer 325 on the first sub-metal layer 323, and a third sub-metal layer 321 between the first sub-metal layer 323 and the first inorganic bank layer 310. In some embodiments, the first metal bank layer 320 may include the first sub-metal layer 323 and the second sub-metal layer 325, while omitting the third sub-metal layer 321.

The first sub-metal layer 323 and the second sub-metal layer 325 may include metals having different etch selectivities. In an embodiment, the first sub-metal layer 323 may include Al, and the second sub-metal layer 325 and the third sub-metal layer 321 may include Ti, for example.

The second inorganic bank layer 340 may be formed on an entirety of the first metal bank layer 320. The second inorganic bank layer 340 may include an inorganic insulating material, such as a silicon oxide, a silicon nitride, and a silicon oxynitride, and have a single layer or multilayer structure including the inorganic insulating material described above.

As illustrated in FIG. 5B, a third inorganic bank layer 330 may be disposed between the second inorganic bank layer 340 and the first metal bank layer 320. The third inorganic bank layer 330 may prevent damage to the first metal bank layer 320 due to a gas, a liquid material, or the like used in various processes, such as an etching process, an ashing process, or the like included in the process of manufacturing a display apparatus. The third inorganic bank layer 330 may include a material that is selectively etched without damage to the first metal bank layer 320. In an embodiment, the third inorganic bank layer 330 may include a conductive oxide, such as IZO and/or IGZO, for example. In some embodiments, any one of the second inorganic bank layer 340 and the third inorganic bank layer 330 may be omitted.

The second metal bank layer 350 may be formed on an entirety of the second inorganic bank layer 340. The second metal bank layer 350 may include a plurality of sub-metal layers including different metals. In this regard, FIG. 5B illustrates that the second metal bank layer 350 includes a fourth sub-metal layer 353, a fifth sub-metal layer 355 on the fourth sub-metal layer 353, and a sixth sub-metal layer 351 between the fourth sub-metal layer 353 and the second inorganic bank layer 340. In some embodiments, the second metal bank layer 350 may include the fourth sub-metal layer 353 and the fifth sub-metal layer 355, while omitting the sixth sub-metal layer 351. In some other embodiments, the second metal bank layer 350 may be provided as a single metal layer.

The fourth sub-metal layer 353 and the fifth sub-metal layer 355 may include metals having different etch selectivities. In an embodiment, the fourth sub-metal layer 353 may include Al, and the fifth sub-metal layer 355 and the sixth sub-metal layer 351 may each include Ti, for example.

Figure 5C:
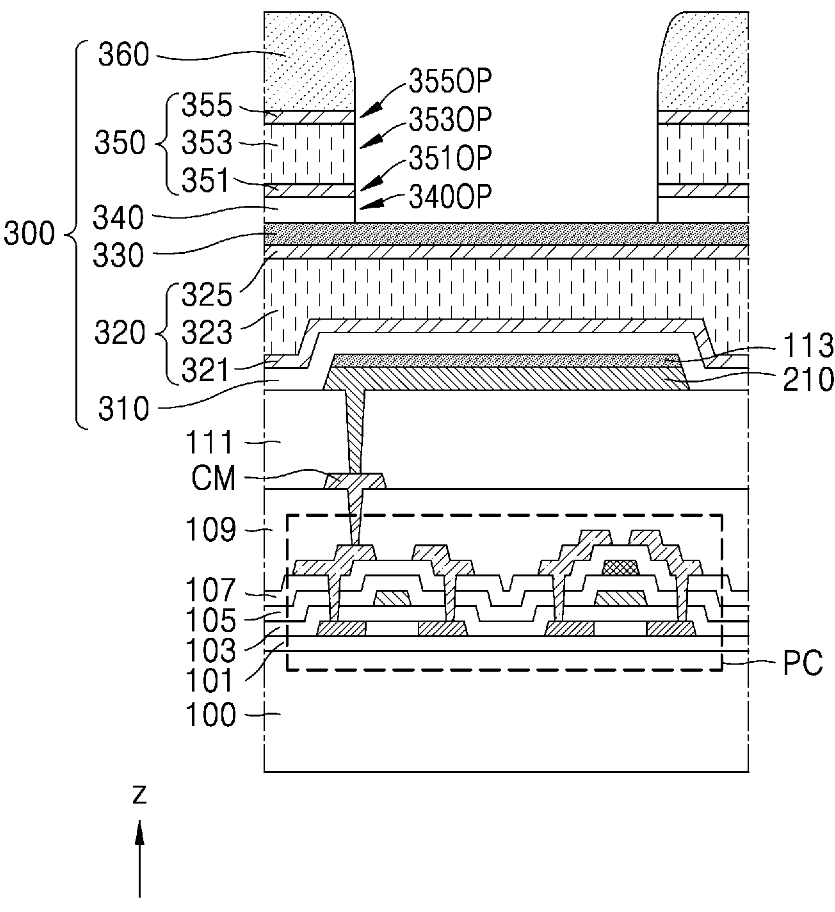

Referring to FIG. 5C, an organic bank layer 360 may be formed on the second metal bank layer 350. The first inorganic bank layer 310, the first metal bank layer 320, the third inorganic bank layer 330, the second inorganic bank layer 340, the second metal bank layer 350, and the organic bank layer 360 may form a bank layer 300.

An opening covering an edge of the pixel electrode 210 and overlapping the pixel electrode 210 may be defined in the organic bank layer 360, when viewed from a direction approximately perpendicular to the upper surface of the substrate 100. A part of an upper surface of the second metal bank layer 350 may be exposed through the opening of the organic bank layer 360.

The organic bank layer 360 may be in black. The organic bank layer 360 may include a light-blocking material and may be provided in black. The light-blocking material may include resin or paste including carbon black, carbon nanotube, or black dye, metal particles, e.g., nickel (Ni), Al, Mo, or any alloys thereof, metal oxide particles, e.g., a chromium oxide, metal nitride particles, e.g., a chromium nitride, or the like. When the organic bank layer 360 includes a light-blocking material, outer reflection due to metal structures arranged below the organic bank layer 360 may be reduced.

A part of the second metal bank layer 350 and a part of the second inorganic bank layer 340 may be removed by the organic bank layer 360 as a mask. In an embodiment, as illustrated in FIG. 5C, sequentially, a fifth sub-opening 355OP may be defined by removing a part of the fifth sub-metal layer 355, a fourth sub-opening 353OP may be defined by removing a part of the fourth sub-metal layer 353, a sixth sub-opening 351OP may be defined by removing a part of the sixth sub-metal layer 351, and a second bank opening 340OP may be defined by removing a part of the second inorganic bank layer 340, for example.

In an embodiment, a part of the second metal bank layer 350 and a part of the second inorganic bank layer 340 may be removed by dry etching. During an etching process, the third inorganic bank layer 330 may protect the first metal bank layer 320 thereunder.

Figure 5D:
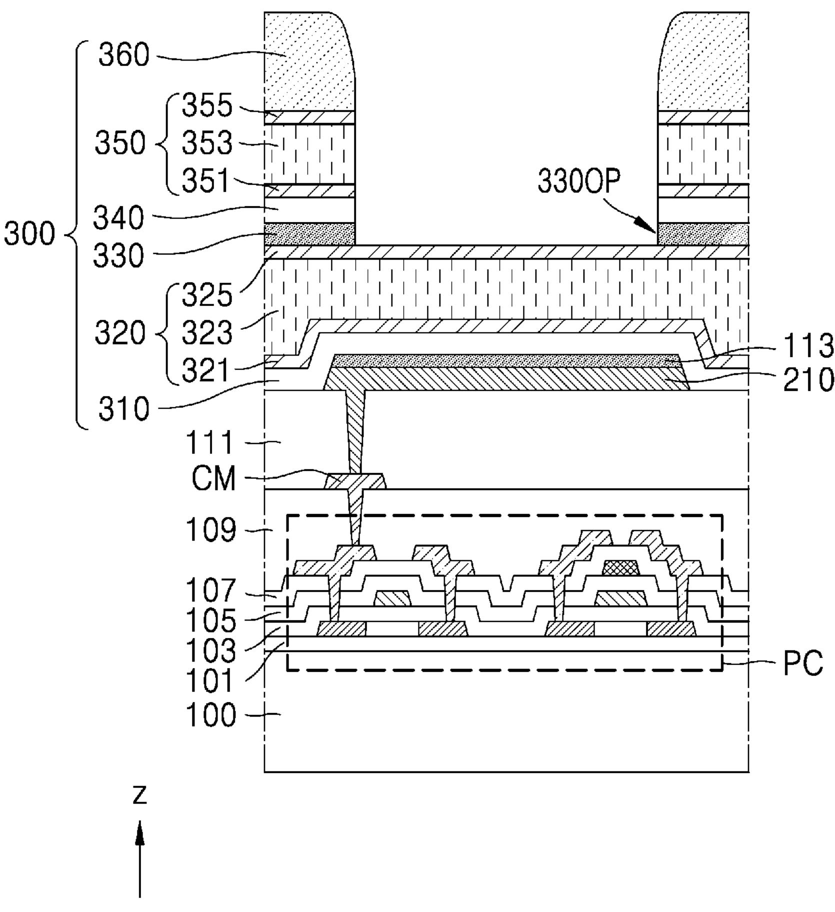

Referring to FIG. 5D, a third bank opening 330OP may be defined by removing a part of the third inorganic bank layer 330. The part of the third inorganic bank layer 330 may be removed by wet etching.

Although FIG. 5D illustrates that the width of the third bank opening 330OP is the same as the width of the second bank opening 340OP, in some embodiments, the width of the third bank opening 330OP may be greater than the width of the second bank opening 340OP. In this case, an undercut structure may be formed, in which the second inorganic bank layer 340 protrudes from a side surface of the third inorganic bank layer 330 defining the third bank opening 330OP.

In some embodiments, further included is a process of removing a part of the fourth sub-metal layer 353 by wet etching, before removing the part of the third inorganic bank layer 330. In some other embodiments, in a process of defining the third bank opening 330OP by removing the part of the third inorganic bank layer 330, a part of the fourth sub-metal layer 353 may be removed. In this case, as the width (or area) of the fourth sub-opening 353OP increases, an undercut structure may be formed in which the fifth sub-metal layer 355 protrudes from a side surface of the fourth sub-metal layer 353 defining the fourth sub-opening 353OP.

Figure 5E:
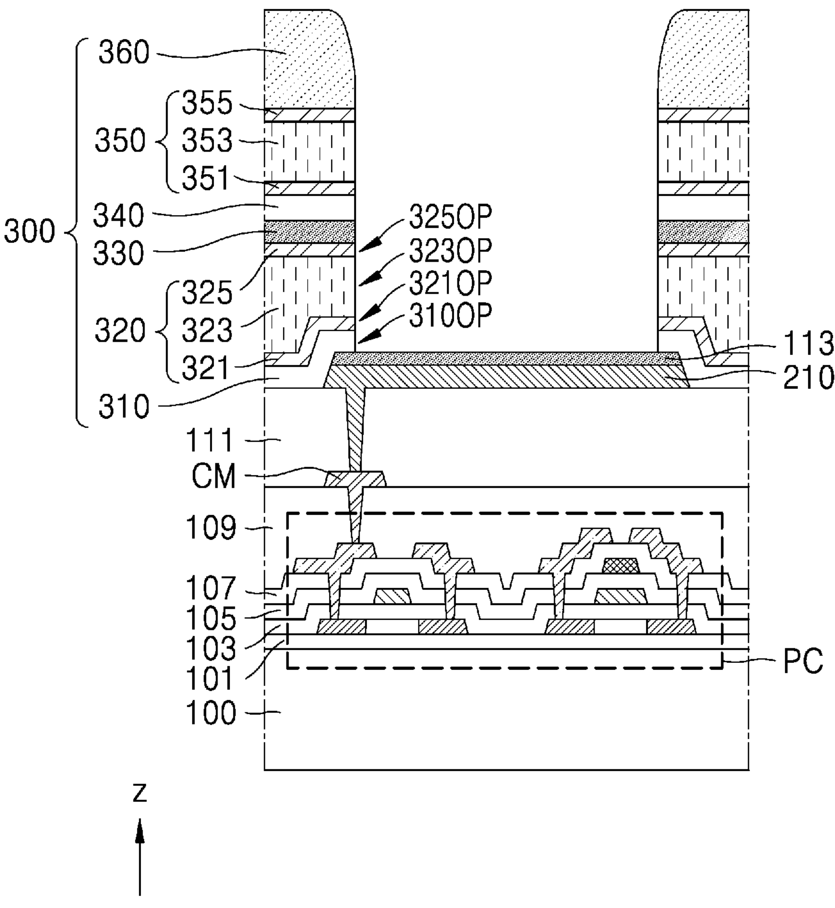

Referring to FIG. 5E, by the organic bank layer 360 and the third inorganic bank layer 330 as a mask, a part of the first metal bank layer 320 and a part of the first inorganic bank layer 310 may be removed. In an embodiment, sequentially, a second sub-opening 325OP may be defined by removing a part of the second sub-metal layer 325, a first sub-opening 323OP may be defined by removing a part of the first sub-metal layer 323, a third sub-opening 321OP may be defined by removing a part of the third sub-metal layer 321, and a first bank opening 310OP may be defined by removing a part of the first inorganic bank layer 310, for example. The first bank opening 310OP of the first inorganic bank layer 310 may overlap a central portion of the pixel electrode 210, and the first inorganic bank layer 310 may overlap an edge of the pixel electrode 210.

In an embodiment, a part of the first metal bank layer 320 and a part of the first inorganic bank layer 310 may be removed by dry etching. In an etching process, the electrode protection layer 113 may protect the pixel electrode 210 thereunder.

As described above, in some embodiments, the bank layer 300 may not include the third inorganic bank layer 330. In this case, a wet etching process to remove the third inorganic bank layer 330 is omitted, and through a continuous dry etching process, a part of the second metal bank layer 350, a part of the second inorganic bank layer 340, a part of the first metal bank layer 320, and a part of the first inorganic bank layer 310 may be removed.

Figure 5F:
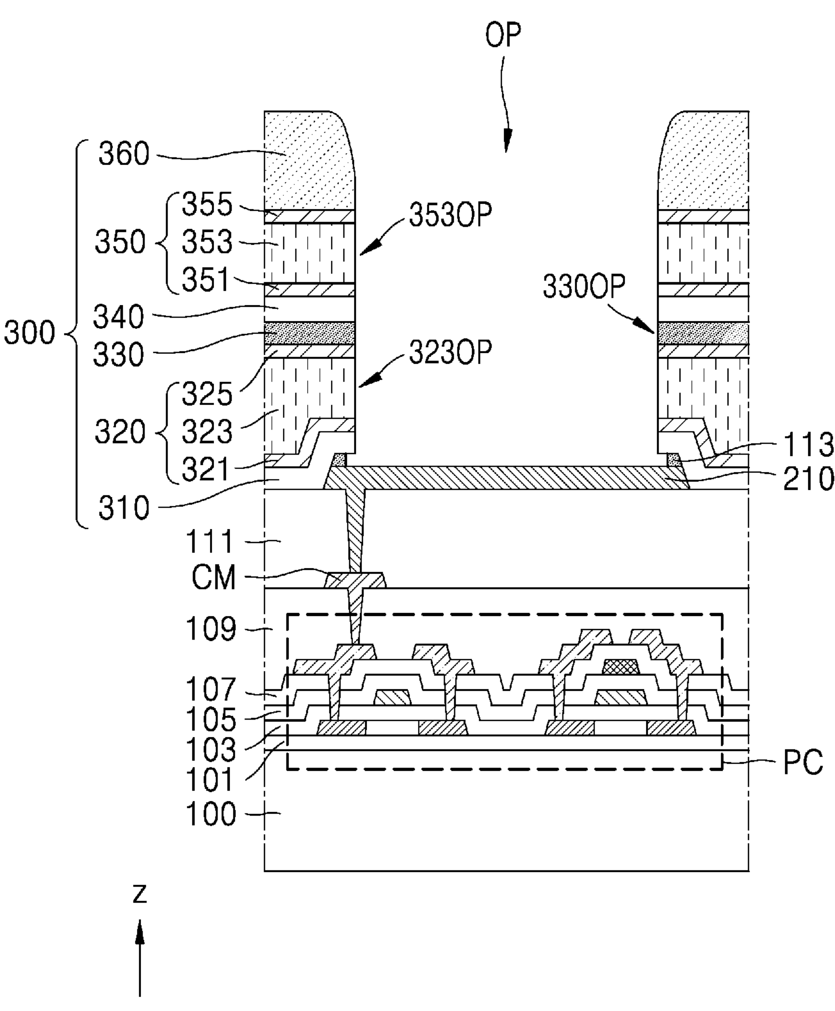

Referring to FIG. 5F, at least a part of the electrode protection layer 113 is removed, and thus, an upper surface of the pixel electrode 210 may be exposed. The at least a part of the electrode protection layer 113 may be removed by wet etching.

In some embodiments, a part of the electrode protection layer 113 disposed between the first inorganic bank layer 310 and the pixel electrode 210 is not removed by wet etching and may remain. Accordingly, the electrode protection layer 113 and the first inorganic bank layer 310 overlap the edge of the pixel electrode 210 to increase a distance between the pixel electrode 210 and the first metal bank layer 320, and a counter electrode of a light-emitting diode described below, thereby preventing generation of arc or the like therebetween.

In some other embodiments, the electrode protection layer 113 may be completely removed. In this case, a recess defined by removing the electrode protection layer 113 between the pixel electrode 210 and the first inorganic bank layer 310 may be left empty or filled with an intermediate layer described below.

In some embodiments, in a process of removing the at least a part of the electrode protection layer 113, the part of the third inorganic bank layer 330 may be removed. In this case, the width (or area) of the third bank opening 330OP may be increased.

In some embodiments, in the process of removing the at least a part of the electrode protection layer 113, parts of the first sub-metal layer 323 and/or the fourth sub-metal layer 353 may be removed. In this case, the width (or area) of the first sub-opening 323OP and/or the width (or area) of the fourth sub-opening 353OP may be increased.

According to the process described above, a pixel opening OP that penetrates the second metal bank layer 350, the second inorganic bank layer 340, the third inorganic bank layer 330, the first metal bank layer 320, and the first inorganic bank layer 310 may be defined in the bank layer 300. In other words, the upper surface of the pixel electrode 210 may be exposed from the bank layer 300, through the pixel opening OP.

Figure 5G:
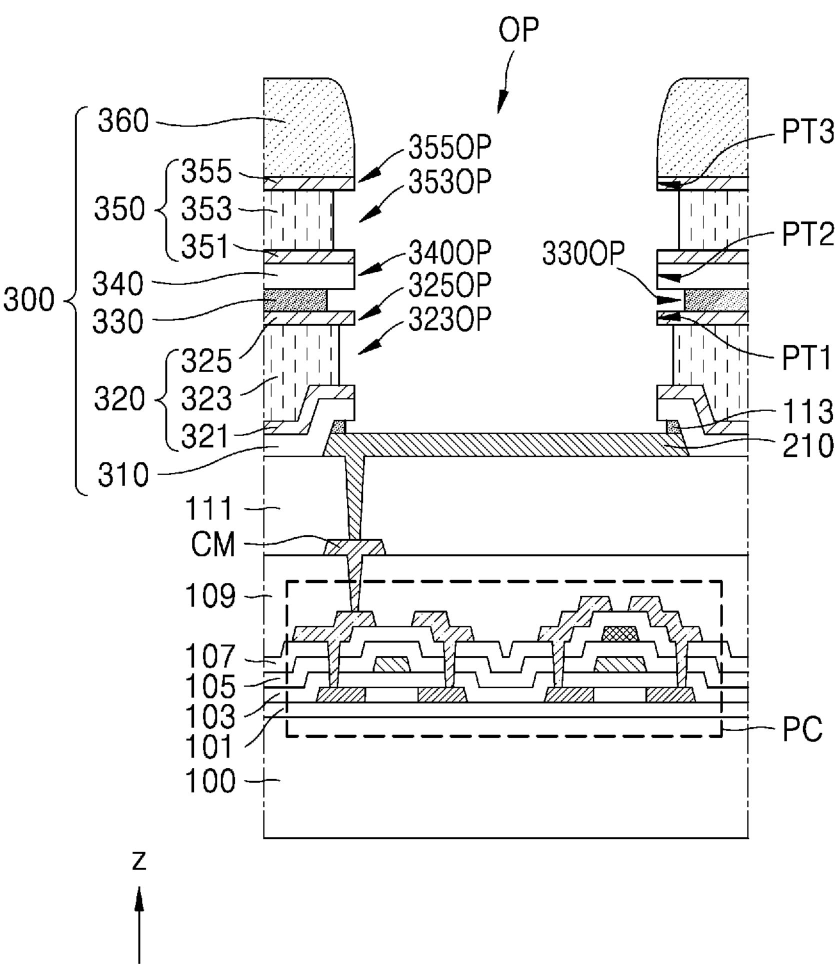

Referring to FIG. 5G, a part of the first sub-metal layer 323, the part of the third inorganic bank layer 330, and a part of the fourth sub-metal layer 353 may be removed by wet etching. In an embodiment, the width (or area) of the first sub-opening 323OP may be greater than the width (or area) of the second sub-opening 325OP of the second sub-metal layer 325, by further removing the part of the first sub-metal layer 323, for example. Accordingly, a first tip PT1 may be formed as the second sub-metal layer 325 protrudes from a side surface of the first sub-metal layer 323 defining the first sub-opening 323OP.

The width (or area) of the third bank opening 330OP may be greater than the width (or area) of the second bank opening 340OP of the second inorganic bank layer 340, by further removing the part of the third inorganic bank layer 330. Accordingly, a second tip PT2 may be formed as the second inorganic bank layer 340 protrudes from the side surface of the third inorganic bank layer 330 defining the third bank opening 330OP.

The width (or area) of the fourth sub-opening 353OP may be greater than the width (or area) of the fifth sub-opening 355OP of the fifth sub-metal layer 355, by further removing the part of the fourth sub-metal layer 353. Accordingly, a third tip PT3 may be formed as the fifth sub-metal layer 355 protrudes a side surface of the fourth sub-metal layer 353 defining the fourth sub-opening 353OP.

As the etch selectivities of the first sub-metal layer 323, the third inorganic bank layer 330, and the fourth sub-metal layer 353 are different from one another, the amounts of the first sub-metal layer 323, the third inorganic bank layer 330, and the fourth sub-metal layer 353 that are removed by wet etching may differ from one another.

Figure 5H:
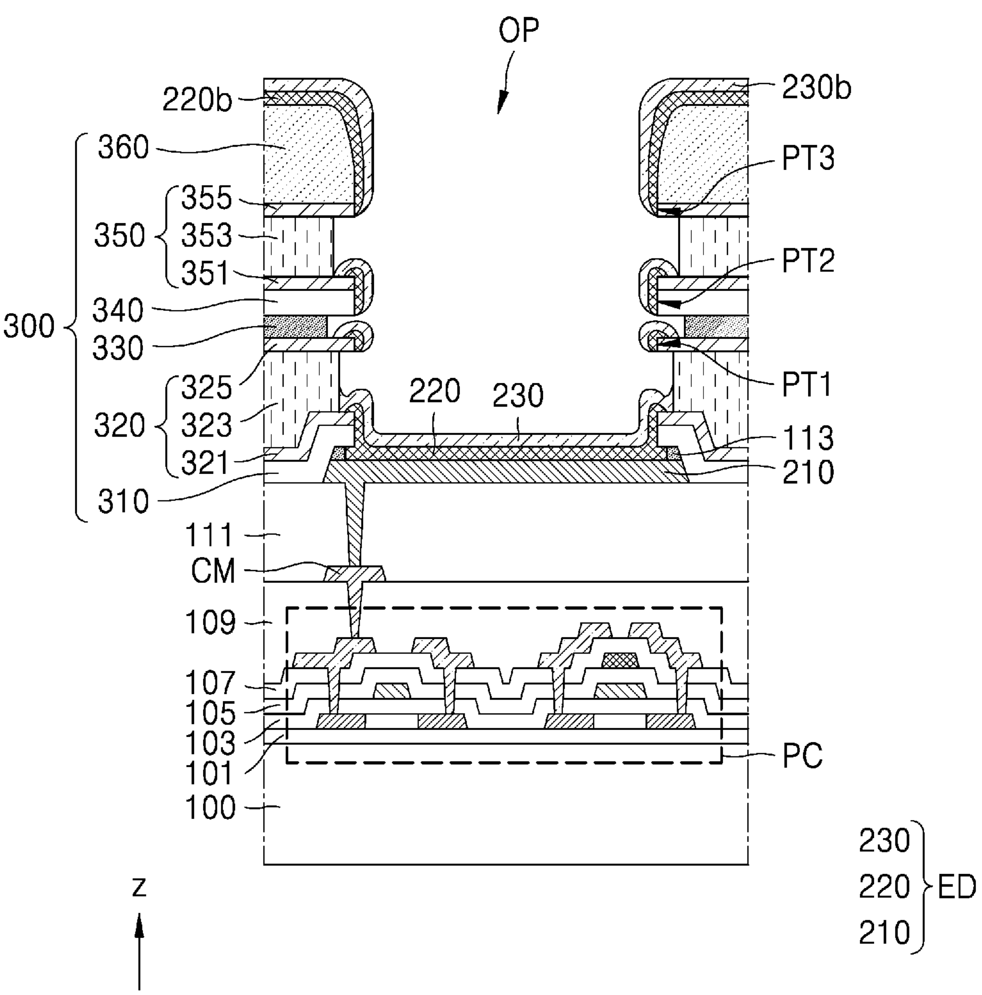
Figure 5I:
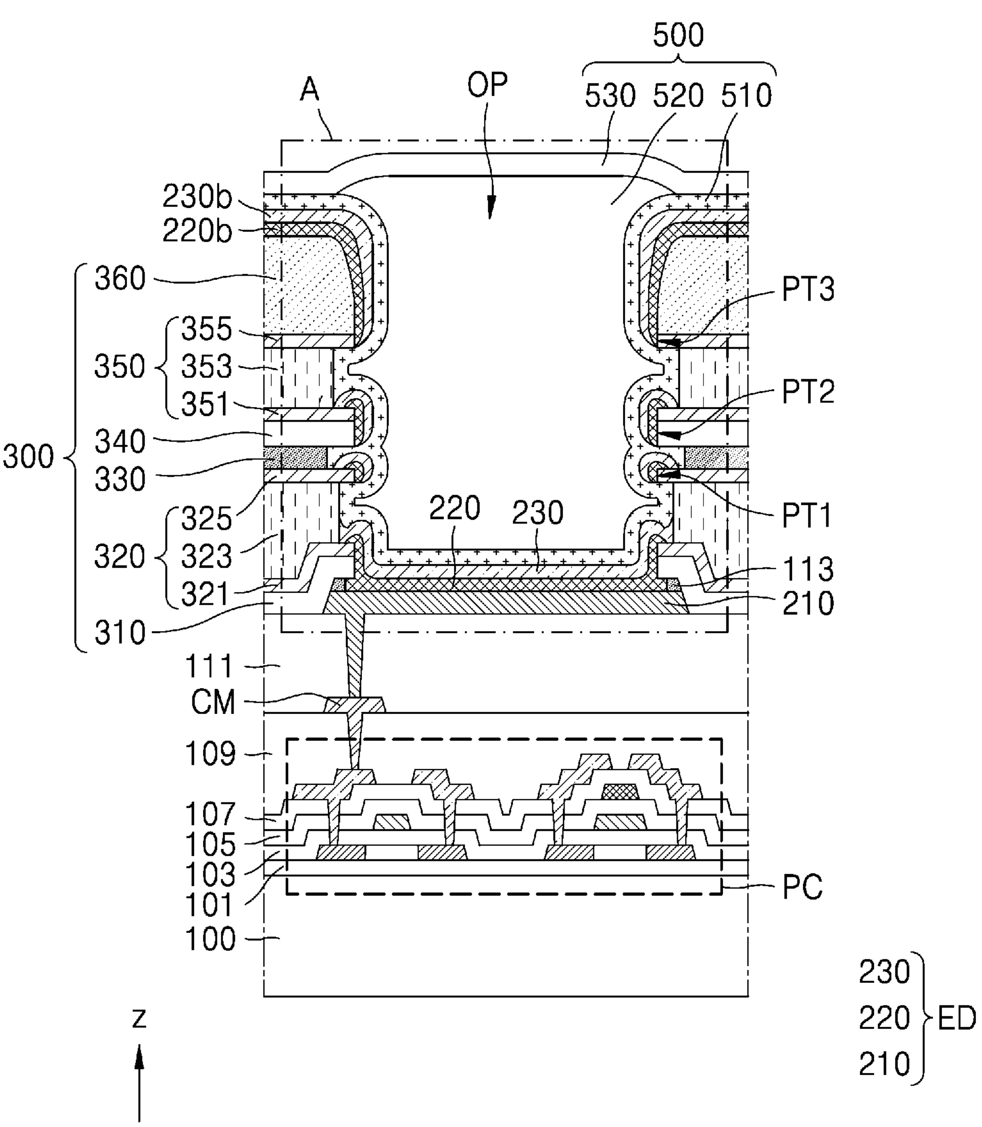

In some embodiments, the organic bank layer 360 may be removed. FIGS. 5H to 5I illustrate a case in which the organic bank layer 360 is not removed and remains. Hereinbelow, a case in which the organic bank layer 360 exists is mainly described.

Referring to FIG. 5H, an intermediate layer 220 and a counter electrode 230 may be formed on the structure described with reference to FIG. 5G to overlap the pixel electrode 210. A stack structure of the pixel electrode 210, the intermediate layer 220, and the counter electrode 230 corresponds to the light-emitting diode ED. In some embodiments, the intermediate layer 220 may be formed by a deposition method, such as a thermal deposition method. In some embodiments, the counter electrode 230 may be formed by a deposition method, such as a thermal deposition method or a sputtering method.

The intermediate layer 220 may include a light-emitting layer that emits light of a predetermined color (red, green, or blue). The light-emitting layer may include a polymer or low-molecular weight organic material. In another embodiment, the light-emitting layer may include an inorganic material or quantum dots.

The intermediate layer 220 may include a first common layer disposed between the pixel electrode 210 and the light-emitting layer, and/or a second common layer disposed between the light-emitting layer and the counter electrode 230. The first common layer may include a hole transport layer ("HTL") and/or a hole injection layer ("HIL"). The second common layer may include an electron transport layer ("ETL") and/or an electron injection layer ("EIL"). The first common layer and the second common layer may each include an organic material.

The intermediate layer 220 may have a single stack structure including a single light-emitting layer, or a tandem structure that is a multi-stack structure including a plurality of light-emitting layers. When the intermediate layer 220 has a tandem structure, a charge generation layer ("CGL") may be disposed between a plurality of stacks.

The intermediate layer 220 may be formed on an entirety of the substrate 100. In an embodiment, as the intermediate layer 220 is deposited without a separate mask, a deposition material for forming the intermediate layer 220 may form a dummy intermediate layer 220*b* on an upper surface of the bank layer 300, an upper surface and a side surface of the first tip PT1, and an upper surface and a side surface of the second tip PT2, for example. The intermediate layer 220 and the dummy intermediate layer 220*b* may be separated and apart from each other by the first tip PT1, the second tip PT2, and the third tip PT3. The intermediate layer 220 and the dummy intermediate layer 220*b* may include the same material of and/or the same number of sub-layers, e.g., the first common layer, the light-emitting layer, and the second common layer.

The counter electrode 230 may include or consist of a conductive material having a substantially low work function. In an embodiment, the counter electrode 230 may include a (semi-)transparent layer, such as silver (Ag), magnesium (Mg), Al, platinum (Pt), palladium (Pd), gold (Au), Ni, neodymium (Nd), iridium (Ir), chromium (Cr), lithium (Li), calcium (Ca), any alloys thereof, or the like, for example. In an alternative embodiment, the counter electrode 230 may further include a layer, such as ITO, IZO, ZnO, or $In_2O_3$, on a (semi-)transparent layer including the material described above.

The counter electrode 230 may be formed on an entirety of the substrate 100. In an embodiment, as the counter electrode 230 is deposited without a separate mask, a deposition material for forming the counter electrode 230 may form a dummy counter electrode 230*b* on an upper surface of the bank layer 300, an upper surface and a side surface of the first tip PT1, and an upper surface and a side surface of the second tip PT2, for example. The counter electrode 230 and the dummy counter electrode 230*b* may be separated and apart from each other by the first tip PT1, the second tip PT2, and the third tip PT3. The counter electrode 230 and the dummy counter electrode 230*b* may each include the same material and/or the same number of sub-layers.

In some embodiments, the intermediate layer 220 may be formed by a thermal deposition process, and the counter electrode 230 may be formed by a sputtering process. The incident direction of the deposition material for forming the counter electrode 230 may be more oblique than a direction in which a deposition material for forming the intermediate layer 220 is incident, based on a direction perpendicular to the substrate 100. The area in which the counter electrode 230 is deposed may be greater than the area in which the intermediate layer 220 is deposited. Accordingly, the counter electrode 230 may be in direct contact with a side surface of the first metal bank layer 320. In an embodiment, as illustrated in FIG. 5H, the counter electrode 230 may be in direct contact with the side surface of the first sub-metal layer 323 beyond an area covered by the intermediate layer 220, for example.

In some embodiments, in a deposition process, an area in which the counter electrode 230 contacts the side surface of the first metal bank layer 320 may be increased by inclining the substrate 100 oblique to the incident direction of the deposition material for forming the counter electrode 230.

As described above, as the first metal bank layer 320 is electrically connected to the common power supply wiring 16 of FIG. 2, the counter electrode 230 may receive the common voltage ELVSS via the first metal bank layer 320.

Although not illustrated in FIG. 5H, a capping layer (not shown) may be disposed on the counter electrode 230. The capping layer may be a layer provided to protect the counter electrode 230 and simultaneously increase a light extraction efficiency. The refractive index of the capping layer may be greater than the refractive index of the counter electrode 230. In an alternative embodiment, the capping layer may be provided by stacking layers having different refractive indexes. In an embodiment, the refractive index of the capping layer may be about 1.7 to about 1.9, for example. The capping layer may include an organic material. The capping layer may further include LiF.

Referring to FIG. 5I, an encapsulation layer 500 including an inorganic encapsulation layer 510, a planarization layer 520, and a protection layer 530 may be formed on the counter electrode 230.

The inorganic encapsulation layer 510 may include one or more inorganic materials of an aluminum oxide, a titanium oxide, a tantalum oxide, a hafnium oxide, a zinc oxide, a silicon oxide, a silicon nitride, and a silicon oxynitride, and may be deposited by a method, such as a chemical vapor deposition method. The inorganic encapsulation layer 510 may be a single layer or multilayer including the material described above.

As the inorganic encapsulation layer 510 has a relatively excellent step coverage, at least a part of a lower surface of the first tip PT1, at least a part of a lower surface of the second tip PT2, and at least a part of the lower surface of the third tip PT3 may be covered. In an embodiment, as illustrated in FIG. 5I, the inorganic encapsulation layer 510 may continuously cover an upper surface and a side surface of the dummy counter electrode 230*b*, the lower surface of the third tip PT3, the side surface of the fourth sub-metal layer 353 defining the pixel opening OP, the lower surface of the second tip PT2, the side surface of the third inorganic bank layer 330 defining the pixel opening OP, the lower surface of the first tip PT1, the side surface of the first sub-metal layer 323 defining the pixel opening OP, and the upper surface of the counter electrode 230, for example.

The inorganic encapsulation layer 510 may form an inorganic contact area by directly contacting the lower surface of the first tip PT1, the lower surface of the second tip PT2, and the lower surface of the third tip PT3. The inorganic contact area forms a closed loop that completely surrounds one light-emitting diode ED, thereby reducing or preventing a path through which impurities, such as moisture and/or air, infiltrate. Furthermore, an adhesive force of the inorganic encapsulation layer 510 may be improved due to unevenness of the first tip PT1, the second tip PT2, and the third tip PT3.

The planarization layer 520 may be formed on the inorganic encapsulation layer 510. The planarization layer 520 may provide a flat base surface to constituent elements arranged above the planarization layer 520, by filling the pixel opening OP of the bank layer 300. The planarization layer 520 may include a polymer-based material. The polymer-based material may include acrylic resin, epoxy-based resin, polyimide, polyethylene, or the like.

In some embodiments, the refractive index of the planarization layer 520 may be greater than the refractive index of the inorganic encapsulation layer 510. In an embodiment, the refractive index of the planarization layer 520 may be about 1.6 or more, for example. The refractive index of the planarization layer 520 may be about 1.6 to about 1.9. The planarization layer 520 may further include dispersed particles for substantially high refractive index. In an embodiment, metal oxide particles, such as a zinc oxide (ZnOx), a titanium oxide ($TiO_2$), a zirconium oxide ($ZrO_2$), a barium titanate ($BaTiO_3$), or the like may be dispersed in the planarization layer 520, for example.

The protection layer 530 may be disposed on the planarization layer 520. The protection layer 530 may include one or more inorganic materials of an aluminum oxide, a titanium oxide, a tantalum oxide, a hafnium oxide, a zinc oxide, a silicon oxide, a silicon nitride, and a silicon oxynitride. The protection layer 530 may prevent damage to the planarization layer 520 in the subsequent process. In an embodiment, the refractive index of the protection layer 530 may be less than the refractive index of the planarization layer 520.

Figure 6:
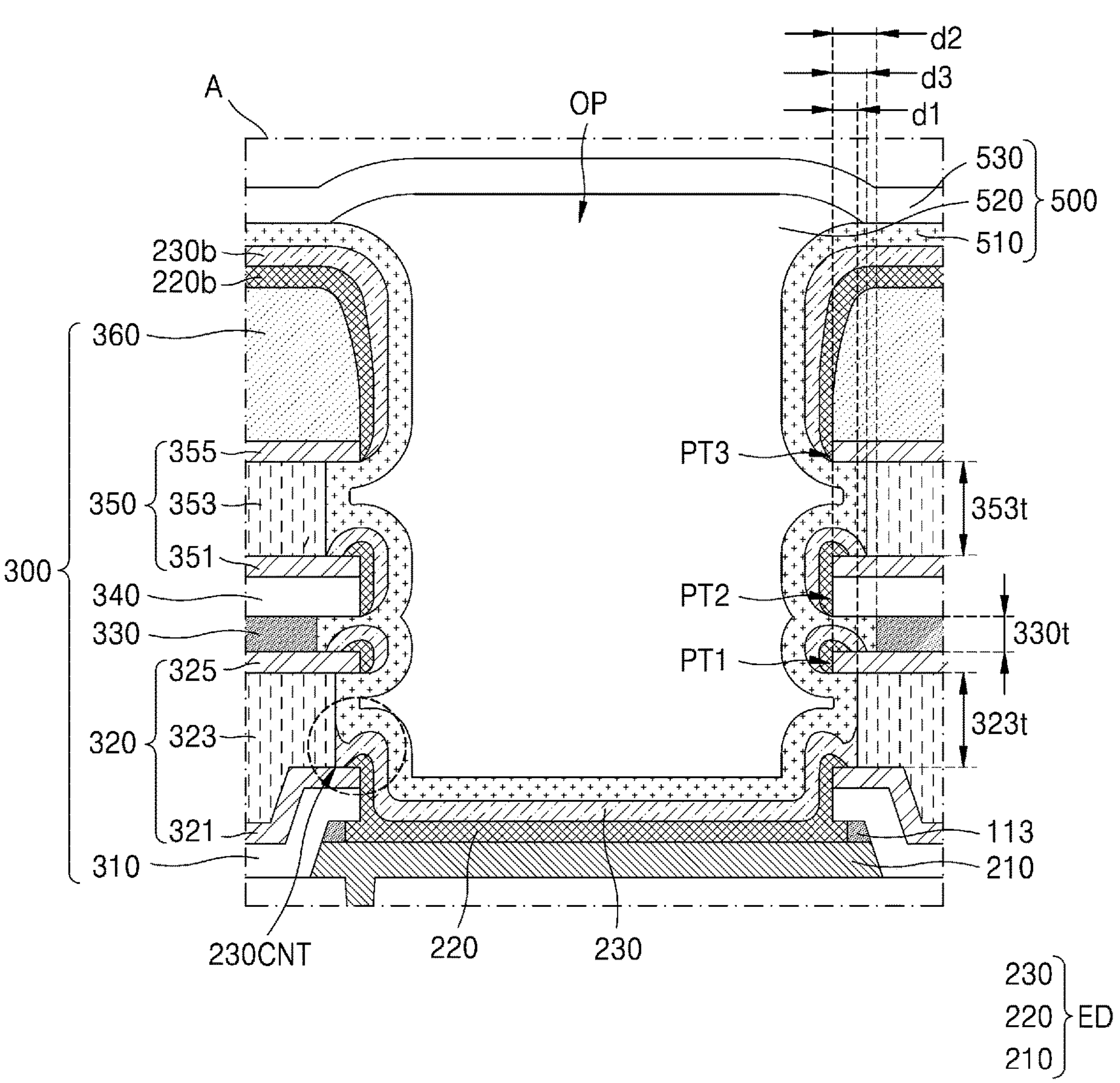
FIG. 6 is a schematic cross-sectional view of an embodiment of a display apparatus.

FIG. 6 is a schematic cross-sectional view of an embodiment of a display apparatus. FIG. 6 illustrates an enlarged view of a region A of the display apparatus of FIG. 5I to described in detail the structure of the bank layer 300.

Referring to FIG. 6, the bank layer 300 may include the first inorganic bank layer 310, the first metal bank layer 320, the third inorganic bank layer 330, the second inorganic bank layer 340, the second metal bank layer 350, and the organic bank layer 360, and the pixel opening OP overlapping the pixel electrode 210 may be defined in the bank layer 300.

The first metal bank layer 320 may include the first sub-metal layer 323 and the second sub-metal layer 325 on the first sub-metal layer 323. The first metal bank layer 320 may further include the third sub-metal layer 321 disposed between the first sub-metal layer 323 and the first inorganic bank layer 310. The part of the second sub-metal layer 325 may form the first tip PT1 protruding from the side surface of the first sub-metal layer 323 defining the pixel opening OP. In other words, the second sub-metal layer 325 may include the first tip PT1.

The part of the second inorganic bank layer 340 may form the second tip PT2 protruding from the side surface of the third inorganic bank layer 330 defining the pixel opening OP. In other words, the second inorganic bank layer 340 may include the second tip PT2.

The second metal bank layer 350 may include the fourth sub-metal layer 353 and the fifth sub-metal layer 355 on the fourth sub-metal layer 353. The second metal bank layer 350 may further include the sixth sub-metal layer 351 disposed between the second inorganic bank layer 340 and the fourth sub-metal layer 353. The part of the fifth sub-metal layer 355 may form the third tip PT3 protruding from the side surface of the fourth sub-metal layer 353 defining the pixel opening OP. In other words, the fifth sub-metal layer 355 may include the third tip PT3.

A protruding length d1 of the first tip PT1, a protruding length d2 of the second tip PT2, and a protruding length d3 of the third tip PT3 may be the same or different from one another. The protruding length d1 of the first tip PT1 may be about 2 micrometers (μm) or less. In some embodiments, the length of the first tip PT1 may be about 0.3 μm to about 1 μm, or about 0.3 μm to about 0.7 μm. Although FIG. 6 illustrates that the protruding length d2 of the second tip PT2 is greater than the protruding length d1 of the first tip PT1 and the protruding length d3 of the third tip PT3, the disclosure is not limited thereto.

In some embodiments, as described above, in the process of removing the third inorganic bank layer 330 by wet etching, the part of the fourth sub-metal layer 353 is removed together, and thus, the protruding length d1 of the first tip PT1 may be less than the protruding length d3 of the third tip PT3. In some other embodiments, a thickness 323*t* of the first sub-metal layer 323 may be different form a thickness 353*t* of the fourth sub-metal layer 353. In this case, an etching speed may vary due to a difference in the area exposed to an etching material even when the layers include the same material. In an embodiment, the thickness 323*t* of the first sub-metal layer 323 is less than the thickness 353*t* of the fourth sub-metal layer 353, the protruding length d1 of the first tip PT1 may be less than the protruding length d3 of the third tip PT3, for example. Likewise, the protruding length d2 of the second tip PT2 may be determined by adjusting a thickness 330*t* of the third inorganic bank layer 330.

The intermediate layer 220 and the counter electrode 230 may overlap the pixel electrode 210, through the pixel opening OP that penetrates the bank layer 300. As the intermediate layer 220 and the counter electrode 230 are formed over an entirety of the substrate 100, the dummy intermediate layer 220*b* and the dummy counter electrode 230*b* may be formed on the upper surface of the bank layer 300, the upper surface and the side surface of the second tip PT2, and the upper surface and the side surface of the first tip PT1. The intermediate layer 220 may be separated and apart from the dummy intermediate layer 220*b* by the first tip PT1, the second tip PT2, and the third tip PT3. Likewise, the counter electrode 230 may be separated and apart from the dummy counter electrode 230*b* by the first tip PT1, the second tip PT2, and the third tip PT3.

As the angle of incidence of a deposition material for forming the counter electrode 230 is greater than the angle of incidence of a deposition material for forming the intermediate layer 220, the counter electrode 230 may extend toward an area covered by the first tip PT1 to be in direct contact with the first metal bank layer 320. In an embodiment, as illustrated in FIG. 6, as the counter electrode 230 extends toward the upper surface of the third sub-metal layer 321 and the side surface of the first sub-metal layer 323, not overlapping the intermediate layer 220, a contact portion 230CNT with which the counter electrode 230 and the first metal bank layer 320 are in direct contact may be formed, for example.

The inorganic encapsulation layer 510 may be formed over an entirety of the counter electrode 230 and the dummy counter electrode 230*b*. As the inorganic encapsulation layer 510 has a relatively excellent step coverage, the inorganic encapsulation layer 510 may cover at least a part of the lower surface of the first tip PT1, at least a part of the lower surface of the second tip PT2, and at least a part of the lower surface of the third tip PT3. The inorganic encapsulation layer 510 may form an inorganic contact area by directly contacting the lower surface of the first tip PT1, the lower surface of the second tip PT2, and the lower surface of the third tip PT3.

The planarization layer 520 may be formed on the inorganic encapsulation layer 510. The planarization layer 520 may provide a flat base surface to the constituent elements arranged above the planarization layer 520, by filling at least a part of the pixel opening OP of the bank layer 300.

In some embodiments, the refractive index of the planarization layer 520 may be greater than the refractive index of the inorganic encapsulation layer 510. In this case, the light emitted from the intermediate layer 220 of the light-emitting diode ED may travel in a direction oblique to a direction (Z-axis direction) perpendicular to the upper surface of the substrate 100, and then, may be refracted at an interface between the inorganic encapsulation layer 510 and the planarization layer 520 to travel in the direction (Z-axis direction) perpendicular to the upper surface of the substrate 100. Accordingly, a light output efficiency, e.g., a front light output efficiency, of a display apparatus may be improved.

The protection layer 530 may be disposed on the planarization layer 520. As illustrated in FIG. 6, the planarization layer 520 may be patterned to correspond to the pixel opening OP. In an embodiment, the planarization layer 520 may be disposed only inside the pixel opening OP, and may not overlap at least a part of the upper surface of the bank layer 300. In this case, the inorganic encapsulation layer 510 may form an inorganic contact area by directly contacting the protection layer 530 above the upper surface of the bank layer 300, for example. Accordingly, even when cracks or the like occur in a part of the protection layer 530, impurities, such as moisture and/or air, may be prevented from propagating into neighboring pixels through the planarization layer 520.

Figure 7:
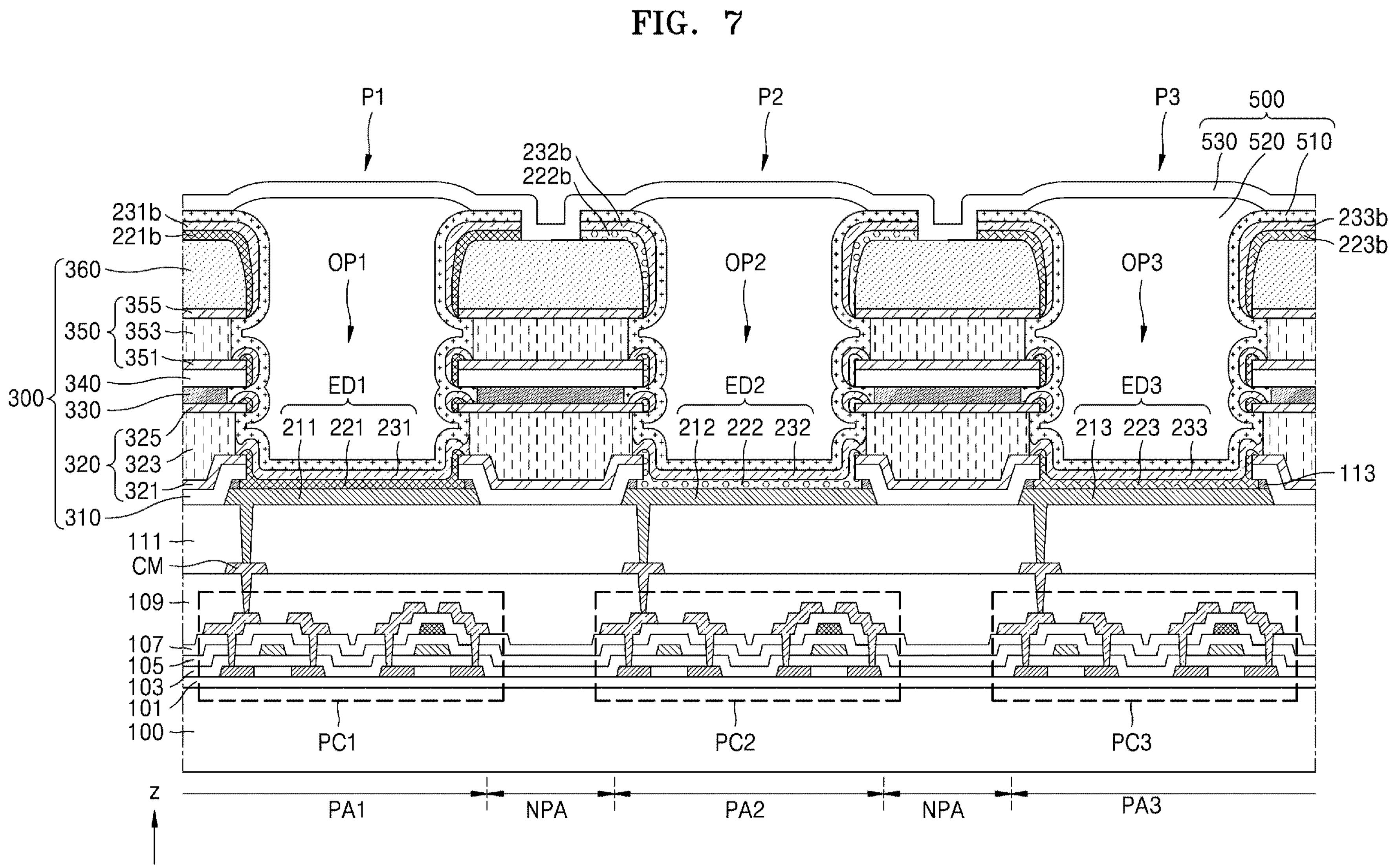
FIG. 7 is a schematic cross-sectional view of an embodiment of a display apparatus.

FIG. 7 is a schematic cross-sectional view of an embodiment of a display apparatus.

Referring to FIG. 7, the substrate 100 may include first to third pixel areas PA1, PA2, and PA3 and a non-pixel area NPA between neighboring pixel areas.

A first light-emitting diode ED1, a second light-emitting diode ED2, and a third light-emitting diode ED3 may be disposed on the substrate 100 apart from one another. The first light-emitting diode ED1 may be disposed in the first pixel area PA1, the second light-emitting diode ED2 may be disposed in the second pixel area PA2, and the third light-emitting diode ED3 may be disposed in the third pixel area PA3.

A first pixel circuit PC1, a second pixel circuit PC2, and a third pixel circuit PC3 may be arranged between the substrate 100 and the first light-emitting diode ED1, the second light-emitting diode ED2, and the third light-emitting diode ED3, respectively. The first pixel circuit PC1, the second pixel circuit PC2, and the third pixel circuit PC3 may each include a transistor and a storage capacitor, as described above with reference to FIG. 5A.

The first light-emitting diode ED1 may be electrically connected to the first pixel circuit PC1. In an embodiment, the first light-emitting diode ED1 may have a stack structure of a first pixel electrode 211, a first intermediate layer 221, and a first counter electrode 231, and the first pixel electrode 211 may be electrically connected to the first pixel circuit PC1, for example.

The second light-emitting diode ED2 may be electrically connected to the second pixel circuit PC2. The second light-emitting diode ED2 may have a stack structure of a second pixel electrode 212, a second intermediate layer 222, and a second counter electrode 232, and the second pixel electrode 212 may be electrically connected to the second pixel circuit PC2.

The third light-emitting diode ED3 may be electrically connected to the third pixel circuit PC3. The third light-emitting diode ED3 may have a stack structure of a third pixel electrode 213, a third intermediate layer 223, and a third counter electrode 233, and the third pixel electrode 213 may be electrically connected to the third pixel circuit PC3.

The first intermediate layer 221, the second intermediate layer 222, and the third intermediate layer 223 may each include a light-emitting layer, a first common layer, and/or a second common layer, as described above with reference to FIG. 5H, and detailed structure and material are as described above. The light-emitting layer of the first intermediate layer 221, the light-emitting layer of the second intermediate layer 222, and the light-emitting layer of the third intermediate layer 223 may respectively emit light of different colors.

The first pixel electrode 211, the second pixel electrode 212, and the third pixel electrode 213 may each include an inner portion and an outer portion surrounding the inner portion. In the specification, "the outer portion (or peripheral portion) of a pixel electrode" means "a part of a pixel electrode including an edge of the pixel electrode," and "the inner portion of a pixel electrode" means the other portion of the pixel area surrounded by the outer portion (or peripheral portion) described above.

The first intermediate layer 221 contacts the inner portion of the first pixel electrode 211, and the first counter electrode 231 may be stacked on the first intermediate layer 221. The first inorganic bank layer 310 may be disposed on the outer portion of the first pixel electrode 211. The first inorganic bank layer 310 may extend over the second organic insulating layer 111 to overlap the outer portion of the first pixel electrode 211 and cover the edge of the first pixel electrode 211.

Similarly, the second intermediate layer 222 may contact the inner portion of the second pixel electrode 212, and the second counter electrode 232 may be stacked on the second intermediate layer 222. The first inorganic bank layer 310 may be disposed on the outer portion of the second pixel electrode 212. The third intermediate layer 223 may contact the inner portion of the third pixel electrode 213, and the third counter electrode 233 may be stacked on the third intermediate layer 223. The first inorganic bank layer 310 may be disposed on the outer portion of the third pixel electrode 213.

The electrode protection layer 113 may be disposed between the first pixel electrode 211 and the first inorganic bank layer 310, between the second pixel electrode 212 and the first inorganic bank layer 310, and between the third pixel electrode 213 and the first inorganic bank layer 310.

The bank layer 300 may include the first inorganic bank layer 310, the first metal bank layer 320, the third inorganic bank layer 330, the second inorganic bank layer 340, the second metal bank layer 350, and the organic bank layer 360. The first metal bank layer 320 may include the first sub-metal layer 323, the second sub-metal layer 325, and the third sub-metal layer 321. In some embodiments, the third sub-metal layer 321 may be omitted may be omitted. The second metal bank layer 350 may include the fourth sub-metal layer 353, the fifth sub-metal layer 355, and the sixth sub-metal layer 351. In some embodiments, the fifth sub-metal layer 355 and/or the sixth sub-metal layer 351 may be omitted.

A first pixel opening OP1 overlapping the first pixel electrode 211, a second pixel opening OP2 overlapping the second pixel electrode 212, and a third pixel opening OP3 overlapping the third pixel electrode 213 may be defined in the bank layer 300. The first pixel opening OP1, the second pixel opening OP2, and the third pixel opening OP3 of the bank layer 300 each have the same structure as the pixel opening OP of FIG. 5F described above with reference to FIGS. 5F to 5I.

Each of the first pixel opening OP1, the second pixel opening OP2, and the third pixel opening OP3 may penetrate from the upper surface of the bank layer 300 to a bottom surface thereof, and include a plurality of tips protruding inwardly. In an embodiment, the second sub-metal layer 325 may have the first tip PT1 protruding from the side surface of the first sub-metal layer 323 defining each of the first pixel opening OP1, the second pixel opening OP2, and the third pixel opening OP3, for example. The second inorganic bank layer 340 may include the second tip PT2 protruding from the side surface of the third inorganic bank layer 330 defining each of the first pixel opening OP1, the second pixel opening OP2, and the third pixel opening OP3. The fifth sub-metal layer 355 may include the third tip PT3 protruding from the side surface of the fourth sub-metal layer 353. The third tip PT3 may define each of the first pixel opening OP1, the second pixel opening OP2, and the third pixel opening OP3. In some embodiments, the second tip PT2 or the third tip PT3 may be omitted.

In an embodiment of the display apparatus, the first intermediate layer 221, the second intermediate layer 222, and the third intermediate layer 223, and the first counter electrode 231, the second counter electrode 232, and the third counter electrode 233 may be deposited without using a separate mask. Accordingly, a first dummy intermediate layer 221*b*, a second dummy intermediate layer 222*b*, and a third dummy intermediate layer 223*b*, and a first dummy counter electrode 231*b*, a second dummy counter electrode 232*b*, and a third dummy counter electrode 233*b*, may be arranged on the bank layer 300.

The first dummy intermediate layer 221*b* may include the same material as and/or the same number of sub-layers as the first intermediate layer 221. The second dummy intermediate layer 222*b* may include the same material as and/or the same number of sub-layers as the second intermediate layer 222. The third dummy intermediate layer 223*b* may include the same material as and/or the same number of sub-layers as the third intermediate layer 223.

The first dummy counter electrode 231*b* may include the same material as and/or the same number of sub-layers as the first counter electrode 231. The second dummy counter electrode 232*b* may include the same material as and/or the same number of sub-layers as the second counter electrode 232. The third dummy counter electrode 233*b* may include the same material as and/or the same number of sub-layers as the third counter electrode 233.

Although FIG. 7 illustrates that the first dummy intermediate layer 221*b*, the second dummy intermediate layer 222*b*, and the third dummy intermediate layer 223*b* do not overlap one another, and the first dummy counter electrode 231*b*, the second dummy counter electrode 232*b*, and the third dummy counter electrode 233*b* do not overlap one another, the disclosure is not limited thereto. In some embodiments, in the non-pixel area NPA, parts of the first dummy intermediate layer 221*b*, the first dummy counter electrode 231*b*, the second dummy intermediate layer 222*b*, the second dummy counter electrode 232*b*, the third dummy intermediate layer 223*b*, the third dummy counter electrode 233*b* overlap one another, and thus, a stack structure may be formed.

The first intermediate layer 221, the second intermediate layer 222, and the third intermediate layer 223 may be separated from the first dummy intermediate layer 221*b*, the second dummy intermediate layer 222*b*, and the third dummy intermediate layer 223*b*, respectively, by the first tip PT1, the second tip PT2, and the third tip PT3. The first counter electrode 231, the second counter electrode 232, and the third counter electrode 233 may be separated from the first dummy counter electrode 231*b*, the second dummy counter electrode 232*b*, and the third dummy counter electrode 233*b*, respectively, by the first tip PT1, the second tip PT2, and the third tip PT3.

Accordingly, the first intermediate layer 221 and the first counter electrode 231 may each have an island shape overlapping the first pixel electrode 211 in the first pixel opening OP1. The second intermediate layer 222 and the second counter electrode 232 may each have an island shape overlapping the second pixel electrode 212 in the second pixel opening OP2. The third intermediate layer 223 and the third counter electrode 233 may each have an island shape overlapping the third pixel electrode 213 in the third pixel opening OP3.

Each of the first counter electrode 231, the second counter electrode 232, and the third counter electrode 233 may be in direct contact with the first metal bank layer 320. In other words, the first counter electrode 231, the second counter electrode 232, and the third counter electrode 233 may be electrically connected to the first metal bank layer 320. In this regard, FIG. 7 illustrates that the first counter electrode 231, the second counter electrode 232, and the third counter electrode 233 are in direct contact with the first sub-metal layer 323 and the third sub-metal layer 321.

The first metal bank layer 320 may be electrically connected to the common power supply wiring 16 of FIG. 2. Accordingly, the common voltage ELVSS may be transmitted to the first counter electrode 231, the second counter electrode 232, and the third counter electrode 233, through the first metal bank layer 320.

The inorganic encapsulation layer 510 may form an inorganic contact area by directly contacting the lower surface of the first tip PT1, the lower surface of the second tip PT2, and the lower surface of the third tip PT3. The inorganic encapsulation layer 510 forms closed loops that completely surrounds each of the first light-emitting diode ED1, the second light-emitting diode ED2 and the third light-emitting diode ED3, thereby reducing or preventing a path through which impurities, such as moisture and/or air, infiltrate. Furthermore, due to the unevenness of the first tip PT1, the second tip PT2, and the third tip PT3, an adhesive force of the inorganic encapsulation layer 510 may be improved.

The planarization layer 520 may be formed on the inorganic encapsulation layer 510. The planarization layer 520 may provide a flat base surface to the constituent elements arranged above the planarization layer 520, by filling the first pixel opening OP1, the second pixel opening OP2, and the third pixel opening OP3 of the bank layer 300.

The protection layer 530 may be formed on the planarization layer 520. The protection layer 530 may be formed on an entirety of the substrate 100. As illustrated in FIG. 7, the planarization layer 520 may be pattered corresponding to each of the first pixel opening OP1, the second pixel opening OP2, and the third pixel opening OP3. In this case, even when cracks or the like occur in a part of the protection layer 530, impurities, such as moisture and/or air, may be prevented from propagating into neighboring pixels through the planarization layer 520

FIGS. 8 to 11 are schematic cross-sectional views of an embodiment of display apparatuses. The display apparatuses illustrated in FIGS. 8 to 11 are similar to the display apparatus described with reference to FIG. 5I, but respectively have some differences, and thus, descriptions about the same or similar constituent elements are omitted, and differences are mainly described.

Figure 8:
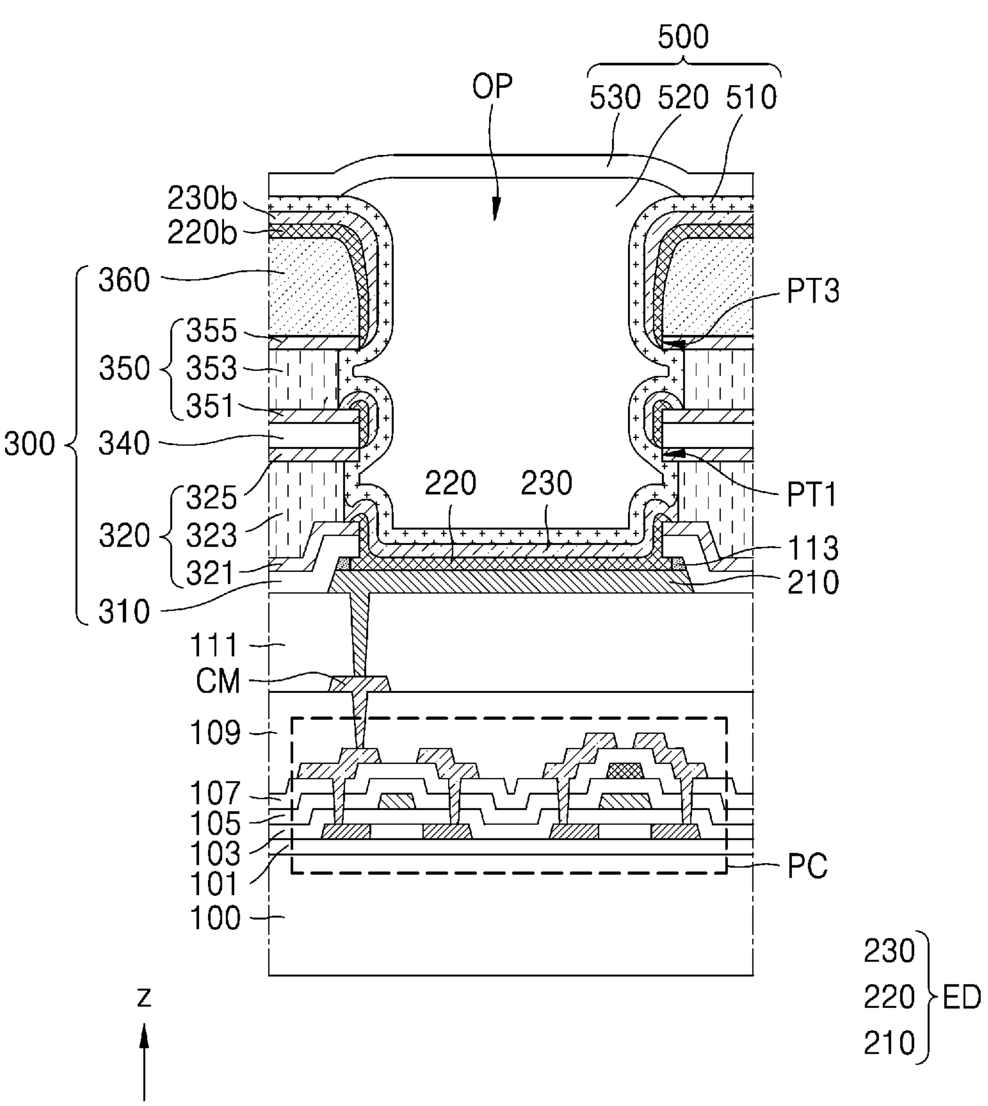
FIGS. 8 to 11 are schematic cross-sectional views of an embodiment of display apparatuses.

The display apparatus of FIG. 8 has a structure similar to the structure described with respect to FIG. 5I, but is different in that the third inorganic bank layer 330 of FIG. 5I is omitted. Referring to FIG. 8, the bank layer 300 may include the first inorganic bank layer 310, the first metal bank layer 320, the second inorganic bank layer 340, the second metal bank layer 350, and the organic bank layer 360.

The first metal bank layer 320 may include the first sub-metal layer 323 and the second sub-metal layer 325 on the first sub-metal layer 323. The first metal bank layer 320 may further include the second sub-metal layer 325 disposed between the first sub-metal layer 323 and the first inorganic bank layer 310. A part of the second sub-metal layer 325 may form the first tip PT1 protruding from the side surface of the first sub-metal layer 323 defining the pixel opening OP. In other words, the second sub-metal layer 325 may include the first tip PT1.

The second metal bank layer 350 may include the fourth sub-metal layer 353 and the fifth sub-metal layer 355 on the fourth sub-metal layer 353. The second metal bank layer 350 may further include the sixth sub-metal layer 351 disposed between the second inorganic bank layer 340 and the fourth sub-metal layer 353. The part of the fifth sub-metal layer 355 may form the third tip PT3 protruding from the side surface of the fourth sub-metal layer 353 defining the pixel opening OP. In other words, the fifth sub-metal layer 355 may include the third tip PT3.

The second inorganic bank layer 340 is disposed between the first metal bank layer 320 and the second metal bank layer 350, and may function as an upper support layer of the first tip PT1. When the second metal bank layer 350 includes the sixth sub-metal layer 351, the second inorganic bank layer 340 may function as a lower support layer of the sixth sub-metal layer 351.

The intermediate layer 220 and the dummy intermediate layer 220*b* may be separated and apart from each other by the first tip PT1 and the third tip PT3. The counter electrode 230 and the dummy counter electrode 230*b* may be separated and apart from each other by the first tip PT1 and the third tip PT3. The inorganic encapsulation layer 510 may form an inorganic contact area by directly contacting the lower surface of the first tip PT1 and the lower surface of the third tip PT3.

Figure 9:
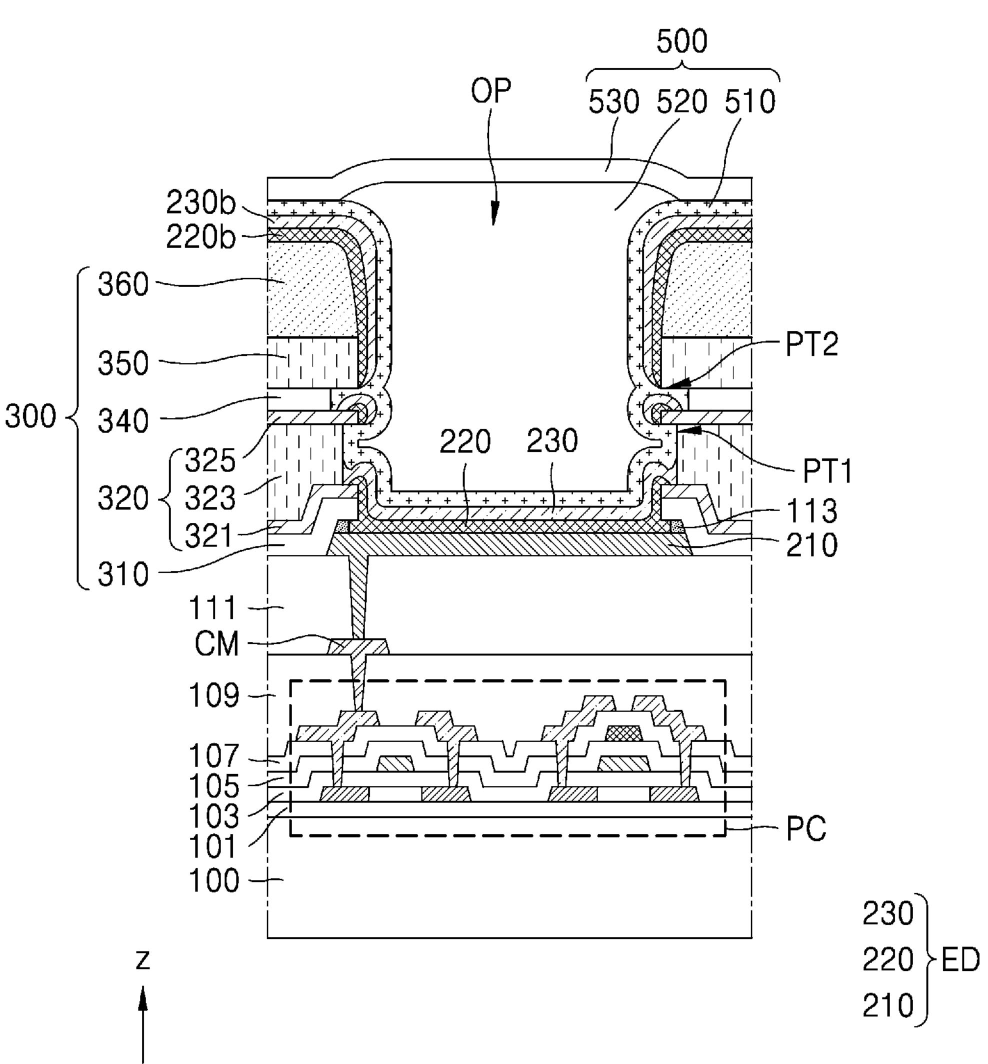

The display apparatus of FIG. 9 has a structure similar to the structure described with respect to FIG. 5I, but is different in that the third inorganic bank layer 330 of FIG. 5I is omitted and the second metal bank layer 350 is formed in a single layer. Referring to FIG. 9, the bank layer 300 may include the first inorganic bank layer 310, the first metal bank layer 320, the second inorganic bank layer 340, the second metal bank layer 350, and the organic bank layer 360.

The first metal bank layer 320 may include the first sub-metal layer 323 and the second sub-metal layer 325 on the first sub-metal layer 323. The first metal bank layer 320 may further include the second sub-metal layer 325 disposed between the first sub-metal layer 323 and the first inorganic bank layer 310. A part of the second sub-metal layer 325 may form the first tip PT1 protruding from the side surface of the first sub-metal layer 323 defining the pixel opening OP. In other words, the second sub-metal layer 325 may include the first tip PT1.

The second metal bank layer 350 may be formed in a single metal layer. The second metal bank layer 350 may include a metal having a different etch selectivity from the first sub-metal layer 323. In an embodiment, the first sub-metal layer 323 may include Al, and the second metal bank layer 350 may include Ti, for example.

The second inorganic bank layer 340 may be selectively etched. Accordingly, a part of the second metal bank layer 350 may form the second tip PT2 protruding from a side surface of the second inorganic bank layer 340 defining the pixel opening OP. In other words, the second metal bank layer 350 may include the second tip PT2.

The intermediate layer 220 and the dummy intermediate layer 220*b* may be separated and apart from each other by the first tip PT1 and the second tip PT2. The counter electrode 230 and the dummy counter electrode 230*b* may be separated and apart from each other by the first tip PT1 and the second tip PT2. The inorganic encapsulation layer 510 may form an inorganic contact area by directly contacting the lower surface of the first tip PT1 and the lower surface of the second tip PT2.

Figure 10:
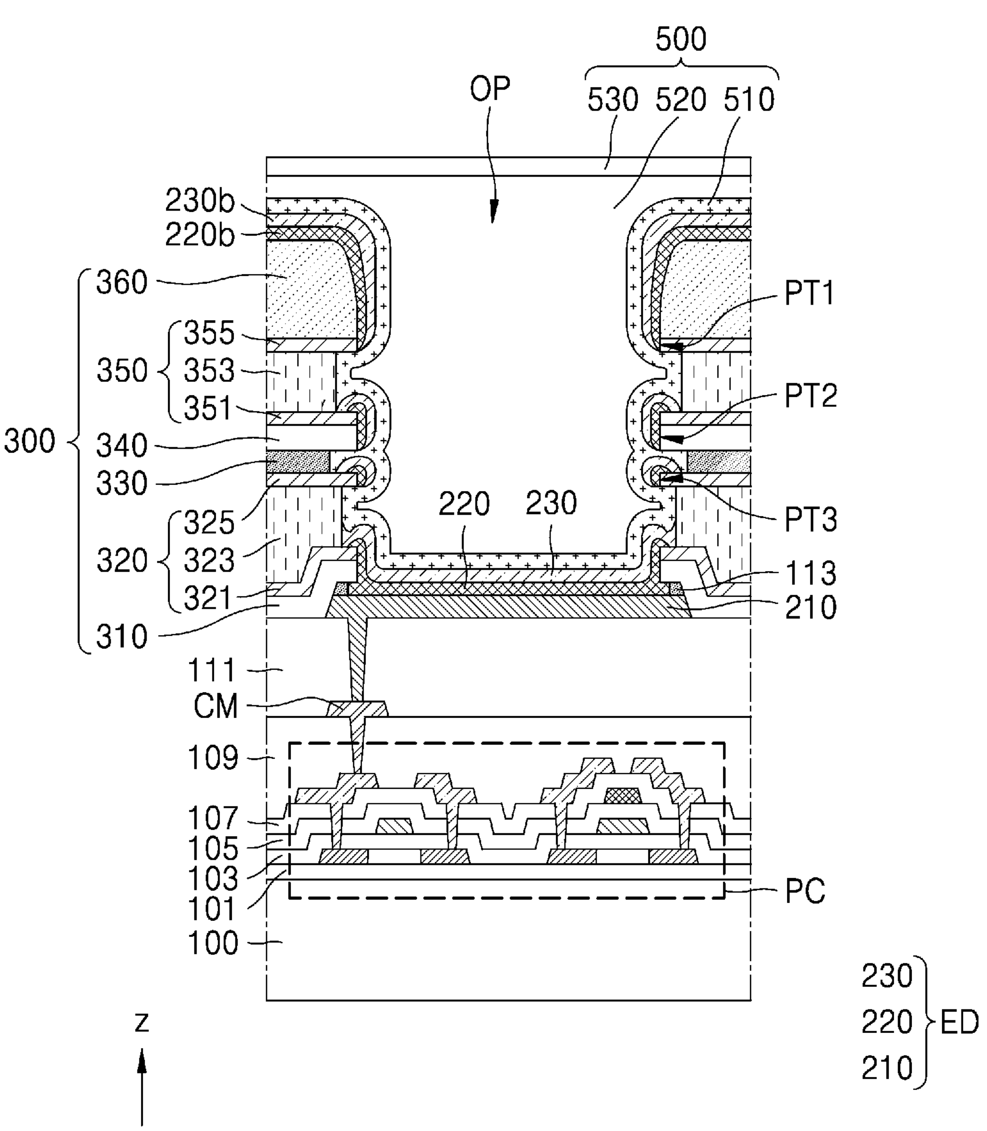

The display apparatus of FIG. 10 has a structure similar to the structure described with respect to FIG. 5I, but is different in that the planarization layer 520 is not patterned corresponding to the pixel opening OP, and is coated on an entirety of the substrate 100.

Referring to FIG. 10, the planarization layer 520 may be disposed on the inorganic encapsulation layer 510. In an embodiment, the planarization layer 520 may be coated on an entirety of the substrate 100, for example. The upper surface of the planarization layer 520 may be disposed higher than the upper surface of the inorganic encapsulation layer 510 disposed on the bank layer 300. Accordingly, the planarization layer 520 may overlap the bank layer 300. As the planarization layer 520 covers an entirety of the bank layer 300, a flatter base surface may be provided to the constituent elements arranged above the planarization layer 520.

In some embodiments, the refractive index of the planarization layer 520 may be greater than the refractive index of the inorganic encapsulation layer 510. In an embodiment, the refractive index of the planarization layer 520 may be about 1.6 or more. The refractive index of the planarization layer 520 may be about 1.6 to about 1.9, for example.

The protection layer 530 may be disposed on the planarization layer 520.

Figure 11:
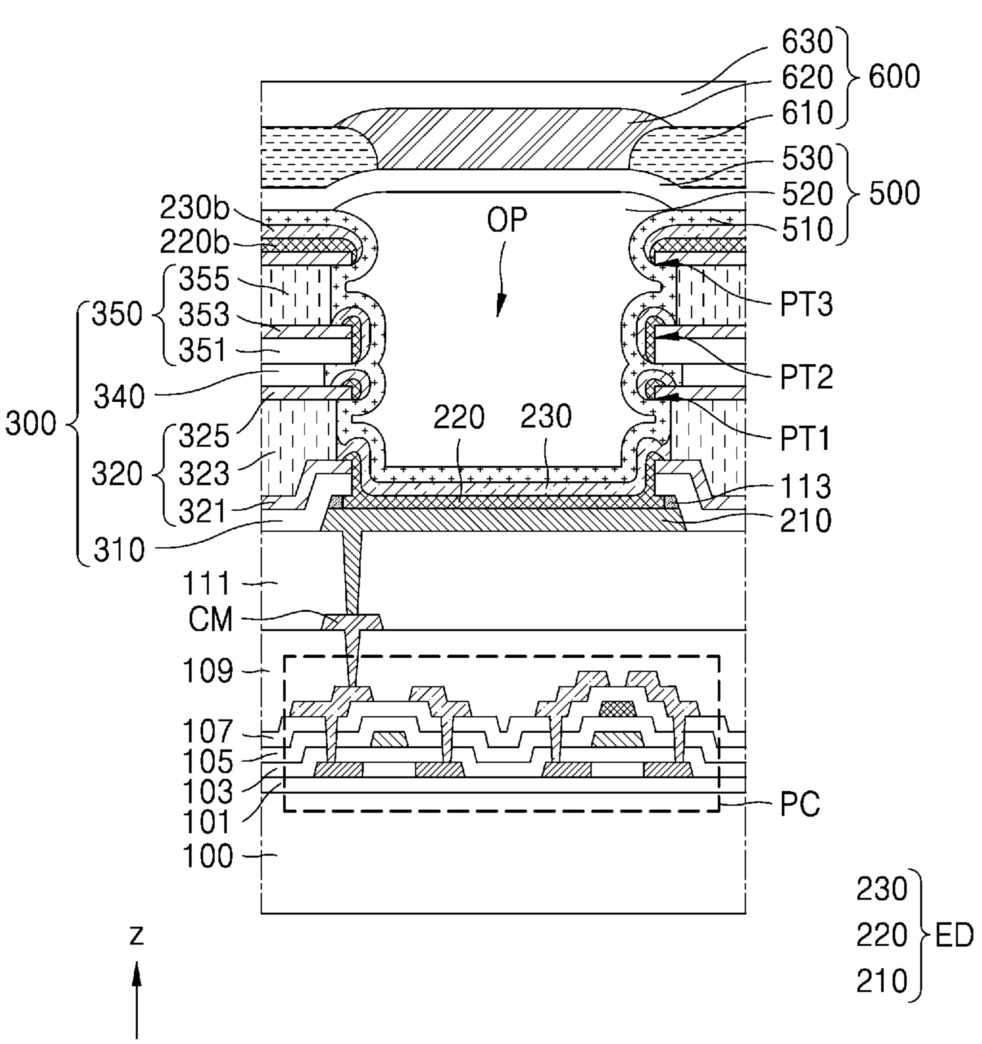

The display apparatus of FIG. 11 has a structure similar to the structure described with respect to FIG. 5I, but is different in that the organic bank layer 360 of FIG. 5I is removed and a reflection control layer 600 is further included.

Referring to FIG. 11, after the pixel opening OP is defined, the organic bank layer 360 of FIG. 5I may be removed. In an embodiment, the bank layer 300 may include the first inorganic bank layer 310, the first metal bank layer 320, the second inorganic bank layer 340, and the second metal bank layer 350, for example.

As the bank layer 300 does not include an organic material, in the process of manufacturing a display apparatus, undesired impurities or the like may be prevented from moving through the bank layer 300. Furthermore, occurrence of a defect in a pixel due to a gas generated from an organic material or the like may be prevented.

The reflection control layer 600 including a light-blocking layer 610, a color filter layer 620, and an overcoat layer 630 may be disposed above the protection layer 530. The reflection control layer 600 may reduce the reflectivity of light (external light) incident on the display apparatus from the outside.

A filter opening corresponding to the pixel opening OP may be defined in the light-blocking layer 610. The light-blocking layer 610 may include a black pigment. The light-blocking layer 610 may be a black matrix. Accordingly, the light-blocking layer 610 may prevent or reduce the reflection of the light incident on the second metal bank layer 350, by covering the upper surface of the bank layer 300.

The color filter layer 620 may be disposed in the filter opening of the light-blocking layer 610 to correspond to the intermediate layer 220 disposed thereunder. The color filter layer 620 may selectively transmit the light emitted by the intermediate layer 220. In an embodiment, when the intermediate layer 220 emits red light, the color filter layer 620 may be a red color filter that selectively transmits red light, for example. When the intermediate layer 220 emits blue light, the color filter layer 620 may be a blue color filter that selectively transmits blue light. When the intermediate layer 220 emits green light, the color filter layer 620 may be a green color filter that selectively transmits green light.

The overcoat layer 630 may cover the light-blocking layer 610 and the color filter layer 620. The overcoat layer 630 is a light-transmitting layer and may provide a flat upper surface by surrounding the unevenness due to the light-blocking layer 610 and the color filter layer 620. The overcoat layer 630 may include a colorless and light-transmitting organic material, such as acryl-based resin.

Although not illustrated in FIG. 11, a low-reflective layer (not shown) may be disposed on the second metal bank layer 350. The low-reflective layer may be a layer having a surface reflectivity less than the second metal bank layer 350. The low-reflective layer may include a metal oxide having a substantially high extinction coefficient k. In an embodiment, the low-reflective layer may include at least one of a copper oxide (CuO), a calcium oxide (CaO), a molybdenum oxide (MoOx), and ZnO, for example. In some embodiments, the low-reflective layer may include a material in which CuO and CaO are mixed.

In embodiments as described above, a display apparatus in which each pixel is encapsulated, and a method of manufacturing the same may be implemented. The scope of the disclosure is not limited by the effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:

a pixel electrode;

a bank layer comprising a first inorganic bank layer, a first metal bank layer, a second inorganic bank layer, and a second metal bank layer, which are sequentially stacked, and in which a pixel opening overlapping the pixel electrode and penetrating the first inorganic bank layer, the first metal bank layer, the second inorganic bank layer, and the second metal bank layer is defined;

an intermediate layer disposed on the pixel electrode through the pixel opening of the bank layer;

a counter electrode disposed on the intermediate layer through the pixel opening of the bank layer; and an inorganic encapsulation layer on the counter electrode, wherein the counter electrode directly contacts a side surface of the first metal bank layer defining the pixel opening.

2. The display apparatus of claim 1, wherein the first metal bank layer comprises:

a first sub-metal layer; and a second sub-metal layer on the first sub-metal layer, and a part of the second sub-metal layer forms a first tip protruding from a side surface of the first sub-metal layer defining the pixel opening.

3. The display apparatus of claim 2, wherein the inorganic encapsulation layer directly contacts a surface of the first tip exposed by the first sub-metal layer.

4. The display apparatus of claim 2, further comprising a third inorganic bank layer between the first metal bank layer and the second inorganic bank layer, wherein the second inorganic bank layer includes a second tip protruding from a side surface of the third inorganic bank layer defining the pixel opening, and the inorganic encapsulation layer directly contacts a surface of the second tip exposed by the third inorganic bank layer.

5. The display apparatus of claim 4, wherein a protruding length of the first tip is different from a protruding length of the second tip.

6. The display apparatus of claim 2, wherein the second metal bank layer includes a second tip protruding from a side surface of the second inorganic bank layer defining the pixel opening, and the inorganic encapsulation layer directly contacts a surface of the second tip exposed by the second inorganic bank layer.

7. The display apparatus of claim 2, wherein the second metal bank layer comprises:

a fourth sub-metal layer; and a fifth sub-metal layer on the fourth sub-metal layer, the fifth sub-metal layer includes a third tip protruding from a side surface of the fourth sub-metal layer defining the pixel opening, and the inorganic encapsulation layer directly contacts a surface of the third tip exposed by the fourth sub-metal layer.

8. The display apparatus of claim 7, wherein a protruding length of the first tip is different from a protruding length of the third tip.

9. The display apparatus of claim 1, further comprising a planarization layer disposed on the inorganic encapsulation layer and filling the pixel opening.

10. The display apparatus of claim 9, further comprising a protection layer on the planarization layer, wherein the inorganic encapsulation layer directly contacts the protection layer, on the second metal bank layer.

11. The display apparatus of claim 9, wherein the inorganic encapsulation layer has a first refractive index, and the planarization layer has a second refractive index greater than the first refractive index.

12. The display apparatus of claim 1, further comprising an organic bank layer between the second metal bank layer and the inorganic encapsulation layer.

13. The display apparatus of claim 1, further comprising:

a light-blocking layer which is disposed on the inorganic encapsulation layer and in which a filter opening overlapping the pixel electrode is defined; and a color filter layer corresponding to the pixel electrode.

14. The display apparatus of claim 1, further comprising an electrode protection layer between an edge of the pixel electrode and the first inorganic bank layer.

15. A method of manufacturing a display apparatus, the method comprising:

forming a pixel electrode and an electrode protection layer corresponding to the pixel electrode;

forming a bank layer on the pixel electrode, the bank layer comprising a first inorganic bank layer, a first metal bank layer, a second inorganic bank layer, a second metal bank layer, and an organic bank layer;

defining a pixel opening overlapping the pixel electrode and penetrating the bank layer;

forming an intermediate layer disposed on the pixel electrode through the pixel opening of the bank layer;

forming a counter electrode disposed on the intermediate layer through the pixel opening of the bank layer and directly contacting a side surface of the first metal bank layer; and forming an inorganic encapsulation layer on the counter electrode.

16. The method of claim 15, wherein the first metal bank layer comprises a first sub-metal layer and a second sub-metal layer on the first sub-metal layer, the defining the pixel opening comprises selectively etching the first sub-metal layer of the first sub-metal layer and the second sub-metal layer, and a part of the second sub-metal layer forms a first tip protruding from a side surface of the first sub-metal layer defining the pixel opening.

17. The method of claim 16, wherein the forming the inorganic encapsulation layer comprises depositing the inorganic encapsulation which directly contacts a surface of the first tip exposed by the first sub-metal layer.

18. The method of claim 15, wherein the forming the bank layer comprises forming a third inorganic bank layer between the first metal bank layer and the second inorganic bank layer, the defining the pixel opening comprises selectively etching the third inorganic bank layer, and a part of the second inorganic bank layer forms a second tip protruding from a side surface of the third inorganic bank layer defining the pixel opening.

19. The method of claim 15, wherein the defining the pixel opening comprises selectively etching the second inorganic bank layer, and the second metal bank layer forms a second tip protruding from a side surface of the second inorganic bank layer defining the pixel opening.

20. The method of claim 15, wherein the second metal bank layer comprises a fourth sub-metal layer and a fifth sub-metal layer on the fourth sub-metal layer, the defining the pixel opening comprises selectively etching the fourth sub-metal layer of the fourth sub-metal layer and the fifth sub-metal layer, and a part of the fifth sub-metal layer forms a third tip protruding from a side surface of the fourth sub-metal layer defining the pixel opening.

21. The method of claim 15, further comprising forming a planarization layer disposed on the inorganic encapsulation layer and filling the pixel opening.

22. The method of claim 15, further comprising removing the organic bank layer between the defining the pixel opening and the forming the intermediate layer.

23. The method of claim 22, further comprising:

forming a light-blocking layer disposed on the inorganic encapsulation layer and defining a filter opening overlapping the pixel electrode; and forming a color filter layer in the filter opening corresponding to the pixel electrode.

* * * * *